(12) United States Patent
Radic

(10) Patent No.: US 12,170,488 B2
(45) Date of Patent: *Dec. 17, 2024

(54) DYNAMIC INTRA-PULSE-SEQUENCE SWITCH TRANSITION-TIME CONTROLLER

(71) Applicant: Silanna Asia Pte Ltd, Singapore (SG)

(72) Inventor: Aleksandar Radic, British Columbia (CA)

(73) Assignee: Silanna Asia Pte Ltd, Singapore (SG)

(*) Notice: Subject to any disclaimer, the term of this patent is extended or adjusted under 35 U.S.C. 154(b) by 0 days.

This patent is subject to a terminal disclaimer.

(21) Appl. No.: 18/469,954

(22) Filed: Sep. 19, 2023

(65) Prior Publication Data
US 2024/0007009 A1    Jan. 4, 2024

Related U.S. Application Data

(63) Continuation of application No. 17/649,636, filed on Feb. 1, 2022, now Pat. No. 11,804,783.

(51) Int. Cl.
*H02M 3/335* (2006.01)
*H02M 1/00* (2007.01)
(Continued)

(52) U.S. Cl.
CPC ..... *H02M 3/33592* (2013.01); *H02M 1/0029* (2021.05); *H02M 1/0035* (2021.05);
(Continued)

(58) Field of Classification Search
CPC .... H02M 1/0029; H02M 1/0035; H02M 1/08; H02M 1/36; H02M 1/44; H02M 3/33592; H03K 17/04206
See application file for complete search history.

(56) References Cited

U.S. PATENT DOCUMENTS 10,355,605 B1    7/2019  Lin et al.
10,855,192 B1    12/2020 Yang et al.
(Continued)

FOREIGN PATENT DOCUMENTS

CN    110247553 A     9/2019
WO    2013075304 A1   5/2013

OTHER PUBLICATIONS

International Search Report and Written Opinion dated Apr. 20, 2023 for PCT Patent Application No. PCT/IB2023/050443.
(Continued)

*Primary Examiner* — Jue Zhang
(74) *Attorney, Agent, or Firm* — MLO, a professional corp.

(57) ABSTRACT

A power converter includes a transformer having a primary-side winding connected to a switch, and a controller connected to a gate node of the switch. The controller includes a switch timing and control module to generate switch control pulses, a gate driver to receive the switch control pulses and generate gate control pulses therefrom to control the switch, and a gate drive controller to provide a switch transition speed control signal to the gate driver to control a switch transition speed of the switch for each pulse of the gate control pulses. Based on an operating mode of the power converter, the gate drive controller is configured to set the switch transition speed of the gate driver to a first speed for generating an initial gate control pulse and to set the switch transition speed of the gate driver to a second speed for generating subsequent gate control pulses.

16 Claims, 17 Drawing Sheets

(51) Int. Cl.
*H02M 1/08* (2006.01)
*H02M 1/36* (2007.01)
*H02M 1/44* (2007.01)
*H03K 17/042* (2006.01)

(52) U.S. Cl.
CPC .............. *H02M 1/08* (2013.01); *H02M 1/36* (2013.01); *H02M 1/44* (2013.01); *H03K 17/04206* (2013.01)

(56) References Cited

U.S. PATENT DOCUMENTS

| | | |
|---|---|---|
| 11,303,195 B2 | 4/2022 | Chung et al. |
| 11,804,783 B2 * | 10/2023 | Radic ................ H02M 3/33592 |
| 2010/0061124 A1 | 3/2010 | Gong et al. |
| 2018/0019677 A1 | 1/2018 | Chung et al. |
| 2018/0262097 A1 | 9/2018 | Chu et al. |
| 2020/0177090 A1 | 6/2020 | Braz et al. |
| 2021/0091675 A1 | 3/2021 | Rajesh et al. |

OTHER PUBLICATIONS

Notice of Allowance and Fees dated Jun. 22, 2023 for U.S. Appl. No. 17/649,636.

\* cited by examiner

1400

DYNAMIC INTRA-PULSE-SEQUENCE SWITCH TRANSITION-TIME CONTROLLER

RELATED APPLICATIONS

This application is a continuation of U.S. patent application Ser. No. 17/649,636, filed Feb. 1, 2022, all of which is incorporated by reference herein in its entirety.

BACKGROUND

Switch-mode power supplies (SMPSs) ("power converters") are widely used in consumer, industrial, and medical applications to provide well-regulated power to a load while maintaining high power processing efficiency, tight-output voltage regulation, and reduced conducted and radiated electromagnetic interference (EMI).

Some power converters, such as flyback-converters, include a transformer that galvanically isolates a primary-side of the power converter from a secondary-side of the power converter. In such power converters, a primary-side switch of the power converter controls a flow of current through a primary-side winding of the transformer to charge a magnetizing inductance of the transformer. A synchronous rectifier switch (e.g., a diode or actively controlled switch) on the secondary-side of the power converter controls a flow of current from a secondary-side winding of the transformer to discharge the energy stored in the magnetizing inductance of the transformer, thereby transferring power to a load of the power converter.

In some operating modes of the power converter, when the primary-side switch turns on, a voltage step may excite a secondary-side resonant LC circuit formed by a leakage inductance of the transformer and a capacitance of the synchronous rectifier switch. Excitation of the secondary-side resonant LC circuit causes a large voltage spike at a drain node of the synchronous rectifier switch as well as undesirable conducted and radiated EMI.

SUMMARY

In some embodiments, a power converter includes a transformer having a primary-side winding electrically connected to a primary-side switch and a secondary-side winding electrically connected to a secondary-side synchronous rectifier switch, and a primary-side control circuit electrically coupled to a gate node of the primary-side switch. The primary-side control circuit includes a switch timing and control module to generate first primary-side switch control pulses, a gate driver circuit to receive the first primary-side switch control pulses and to generate first primary-side gate control pulses therefrom to control the gate node of the primary-side switch, and a gate drive control module to provide a switch transition speed control signal to the gate driver circuit to control a switch transition speed of the primary-side switch for each pulse of the first primary-side gate control pulses. Based on an operating mode of the power converter, the gate drive control module is configured to set the switch transition speed of the gate driver circuit to a first speed for generating one or more initial pulses of the first primary-side gate control pulses and is further configured to set the switch transition speed of the gate driver circuit to a second speed for generating one or more subsequent pulses of the first primary-side gate control pulses.

In some embodiments, a control circuit includes a switch timing and control module to generate first primary-side switch control pulses, a gate driver circuit to receive the first primary-side switch control pulses and to generate first primary-side gate control pulses therefrom to control a gate node of a primary-side switch of a power converter, and a gate drive control module to provide a switch transition speed control signal to the gate driver circuit to control a switch transition speed of the primary-side switch for each pulse of the first primary-side gate control pulses. Based on an operating mode of the power converter, the gate drive control module is configured to set the switch transition speed of the gate driver circuit to a first speed for generating one or more initial pulses of the first primary-side gate control pulses and is further configured to set the switch transition speed of the gate driver circuit to a second speed for generating one or more subsequent pulses of the first primary-side gate control pulses.

DETAILED DESCRIPTION

Figure 1:
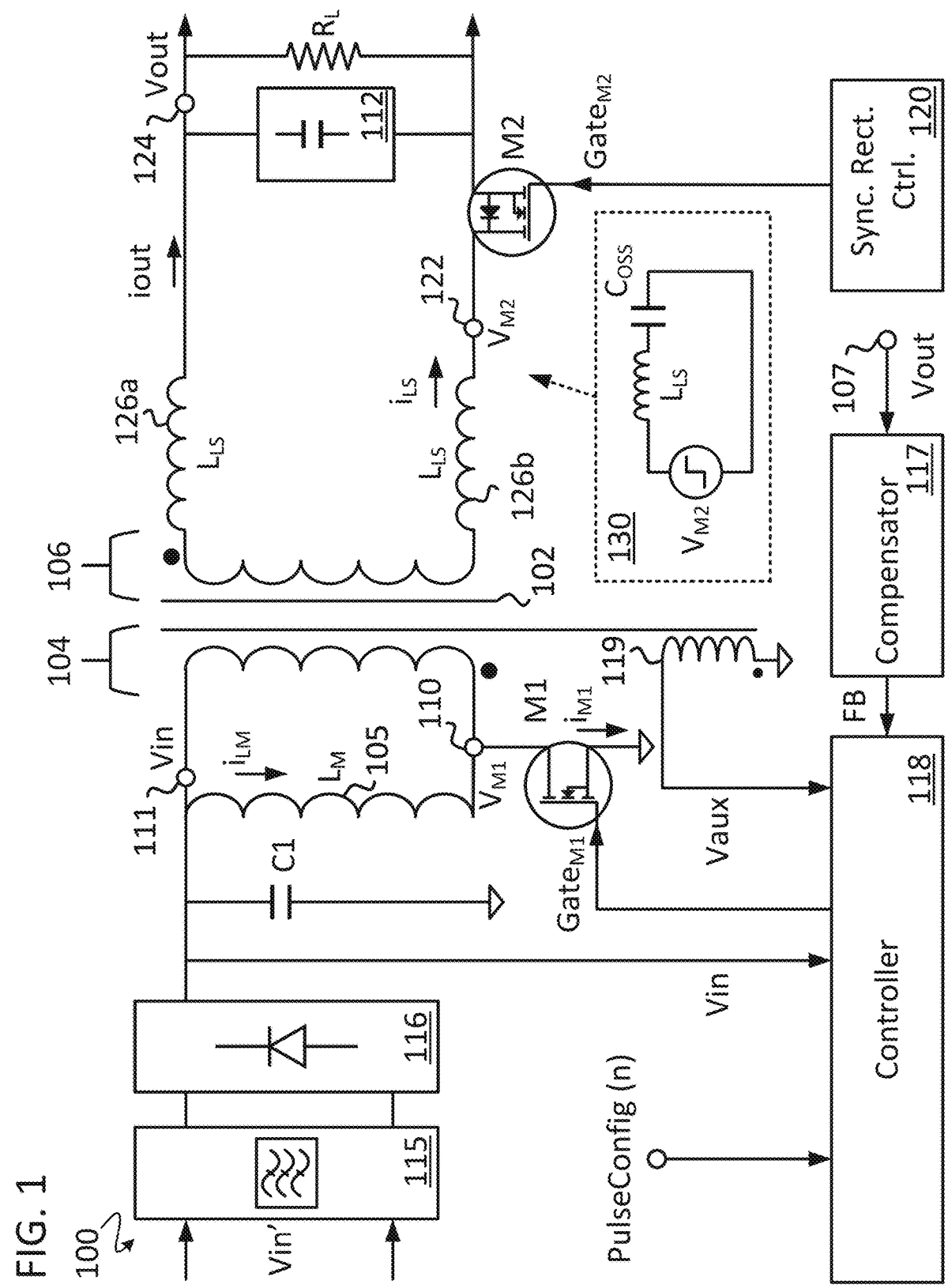
FIG. 1 is a simplified circuit schematic of a power converter, in accordance with some embodiments.

Power converters, such as flyback converters, often include a transformer that galvanically isolates a primary-side of the power converter from a secondary-side of the power converter. In such power converters, a primary-side switch of the power converter controls a flow of current through a primary-side winding of the transformer to charge a magnetizing inductance of the transformer. A synchronous rectifier switch on the secondary-side of the power converter controls a flow of output current from a secondary-side winding of the transformer to discharge the energy stored in the magnetizing inductance of the transformer, thereby transferring power to a load of the power converter. In general, the synchronous rectifier switch is in an OFF-state during a time period that the primary-side switch is in an ON-state, and the synchronous rectifier switch is generally in an ON-state for a portion of the time that the primary-side switch is in an OFF-state.

During a time period that the synchronous rectifier switch is in an ON-state, output current from the secondary winding flows to an output of the power converter. Corresponding to the flow of output current, a magnetizing inductance current of the transformer decreases to zero as energy stored in the transformer is discharged. However, during some operating modes of the power converter, such as during startup mode, continuous conduction mode (CCM), and light-load operation (e.g., skip-pulse mode, and/or burst-mode), energy stored in the transformer may not decrease entirely to zero during each switching cycle. In such scenarios, when the primary-side switch turns on, a voltage step caused by residual energy stored in the transformer may excite a secondary-side resonant LC circuit formed by a leakage inductance of the transformer and a capacitance of the synchronous rectifier switch. Excitation of the secondary-side LC circuit causes a high-voltage spike and subsequent ringing across the synchronous rectifier switch as well as undesirable conducted and radiated EMI due to the ringing. As such, conventional solutions often include a synchronous rectifier switch having a high voltage rating (and resultantly large design footprint), and/or include a secondary-side snubber circuit (which increases a bill of materials for the design).

In some conventional solutions, a slew rate of the primary-side switch is increased during light-load operation such that a slope of the voltage step caused by residual energy stored in the transformer is reduced, thereby reducing an amplitude of the high-voltage spike and subsequent high-frequency ringing. However, in such conventional solutions, a power conversion efficiency of the power converter is significantly reduced due to the increased slew rate of the primary-side switch. Disclosed herein are systems and methods to reduce the amplitude of high-voltage spikes across the synchronous rectifier switch and subsequent ringing while advantageously minimizing losses in power conversion efficiency of the power converter.

FIG. 1 is a simplified circuit schematic of a flyback power converter ("power converter") 100, in accordance with some embodiments. Some elements of the power converter 100 have been omitted from FIG. 1 to simplify the description of the power converter 100 but are understood to be present. In general, the power converter 100 includes a primary-side (i.e., an input) configured to receive an input voltage Vin', and a secondary-side (i.e., an output) configured to provide an output voltage Vout at the node 124 using the input voltage Vin'. The primary-side is coupled to the secondary-side by a transformer 102. The transformer 102 transfers power from the primary-side of the power converter 100 to the secondary-side of the power converter 100 and generally includes a primary winding 104, a secondary winding 106, and an auxiliary winding 119. The primary-side of the power converter 100 generally includes the primary winding 104 of the transformer 102, the auxiliary winding 119, an input voltage filter block 115, a rectifier block 116 (in the case of AC input), an input voltage buffer capacitor C1, a primary-side switch M1, and a primary-side controller ("controller") 118. The primary-side switch M1 is directly electrically connected to a node 110 of the primary winding 104. A magnetizing inductance $L_M$ of the transformer 102 is illustrated as a winding 105. A compensator 117 is part of a control/feedback path from the secondary-side of the power converter 100 to the primary-side of the power converter 100 and is, thus, part of both the primary-side and the secondary-side.

The secondary-side of the power converter 100 generally includes the secondary winding 106 of the transformer 102, an output buffer circuit 112, a secondary-side synchronous rectifier switch M2, and a synchronous rectifier controller 120. The synchronous rectifier switch M2 is directly electrically connected to the secondary winding 106 at node 122. Secondary-side leakage inductance $L_{LS}$ of the transformer 102 is illustrated by windings 126a-b. As shown, the output node 124 of the power converter 100 is configured to be connected to a load $R_L$. The feedback path through the compensator 117 provides a measurement based on the output voltage Vout to the controller 118. A resonant LC circuit formed by the leakage inductance $L_{LS}$ winding 126b and a parasitic output capacitance $C_{OSS}$ of the synchronous rectifier switch M2 is illustrated as the LC circuit 130.

Also shown are nodes 107 and 111. Signals related to operation of the power converter 100 illustrated in FIG. 1 include an optional digital pulse configuration signal PulseConfig(n), a primary-side gate control signal $GATE_{M1}$, a power converter feedback signal FB, the input voltage Vin', a buffered, filtered, or otherwise conditioned input voltage Vin at the node 111, a voltage Vaux at the auxiliary winding 119, a magnetizing inductance current iLM, a primary-side switch current iM1, a drain-source voltage VM1 at a drain node of the primary-side switch M1 (at the node 110), an output current iout of the power converter 100, a secondary-side leakage inductance current iLS, a synchronous rectifier switch control signal GATEM2, and a synchronous rectifier switch drain-source voltage VM2 at a drain node of the synchronous rectifier switch M2.

The voltage Vin' is received at the power converter 100 as an alternating current (AC) or direct current (DC) voltage. The input voltage filter block 115, the rectifier block 116, and the input buffer capacitor C1 provide the filtered, buffered, rectified, or otherwise conditioned input voltage Vin to the transformer 102 at node 111. The primary winding 104 receives the input voltage Vin at node 111. The primary winding 104 is directly electrically connected in series to the drain node of the primary-side switch M1, and a source node of the primary-side switch M1 is electrically coupled to a voltage bias node such as ground. The primary-side switch M1 is controlled at a gate node by the primary-side gate control signal $GATE_{M1}$ (e.g., a pulse-width-modulation (PWM) signal) generated by the controller 118. The primary-side switch M1 controls, in response to the primary-side gate control signal $GATE_{M1}$, the current $i_{M1}$ through the primary winding 104 to charge the magnetizing inductance $L_M$ 105 (as illustrated by the magnetizing inductance current iLM) of the transformer 102 during a first portion of a switching cycle of the power converter 100 (i.e., during an on-time of the primary-side switch M1). The synchronous rectifier switch M2 controls a current flow through the secondary winding 106 to discharge energy stored by the transformer 102 into the output buffer circuit 112 and the load $R_L$ during a subsequent portion of the switching cycle (i.e., during an off-time of the primary-side switch M1).

To elaborate, when the primary-side switch M1 is enabled by the controller 118 during the first portion of the switching cycle, current flows through the primary winding 104 to the voltage bias node. The current flow through the primary winding 104 causes energy to be stored in the magnetizing inductance $L_M$ 105 and a primary-side leakage inductance $L_L$ (not shown) of the transformer 102. When the primary-side switch M1 is disabled in the subsequent portion of the switching cycle, the output voltage Vout is generated at the output buffer circuit 112 and is provided to the load $R_L$. The compensator 117 receives the generated output voltage Vout, or a signal based on Vout, at the node 107 and uses the output voltage Vout to generate the feedback signal FB which is used to adjust an on-time of the primary-side switch M1.

The synchronous rectifier switch M2 provides rectification on the secondary-side of the power converter 100. When the primary-side switch M1 is in an ON-state, the synchronous rectifier switch M2 is in an OFF-state. After the primary-side switch M1 transitions to an OFF-state, the synchronous rectifier switch M2 transitions to an ON-state. During a time period that the synchronous rectifier switch M2 is in an ON-state, the output current iout flows from the secondary winding 106 to the output buffer circuit 112 and to the load $R_L$. As the output current iout flows from the secondary winding 106, the magnetizing inductance current $i_{LM}$ flow decreases towards zero as energy stored in the primary-side switch M1 output capacitance is discharged.

The secondary-side leakage inductance $L_{LS}$ 126b is in series with a parasitic output capacitance $C_{OSS}$ of the synchronous rectifier switch M2, thereby forming the LC circuit 130. When the primary-side switch M1 transitions back to an ON-state, a voltage step caused by a rapid rise in voltage at the drain node of the synchronous rectifier switch M2 (i.e., at the node 122) excites the resonant secondary-side LC circuit 130, thereby creating a high-voltage spike at the drain node of the synchronous rectifier switch M2 and subsequent high-frequency (e.g., greater than 10 MHz) voltage and current ringing at the secondary-side of the power converter 100 which results in voltage stress to the synchronous rectifier switch M2 and undesirable radiated and conducted EMI.

By slowing a rate at which the primary-side switch M1 transitions from the OFF-state to the ON-state (i.e., the drain-to-source negative voltage slew rate), a voltage rise-time at the drain node of the synchronous rectifier switch M2 is likewise slowed, and the high-voltage spike at the drain node of the synchronous rectifier switch M2 and subsequent high-frequency ringing may be mitigated. However, a lower slew rate conventionally results in an overall loss in power processing efficiency of conventional power converters.

As compared to conventional solutions, systems and methods disclosed herein advantageously reduce a voltage amplitude of a voltage spike at the drain node of the synchronous rectifier switch and subsequent high-frequency ringing on the secondary-side of the power converter 100 while only minimally impacting power processing efficiency thereof. Additionally, because the voltage amplitude of a voltage spike at the drain node of the synchronous rectifier switch M2 is reduced, a smaller synchronous rectifier switch M2 (e.g., FET rated for 100V or 85V) may be used in the design of the power converter 100 as compared to a size of a synchronous rectifier switch M2 that would be needed if the voltage spike at the drain node of the synchronous rectifier switch M2 were not reduced (e.g., a FET rated for 120V), and a secondary-side snubber circuit may be advantageously omitted from the power converter design.

Figure 2:
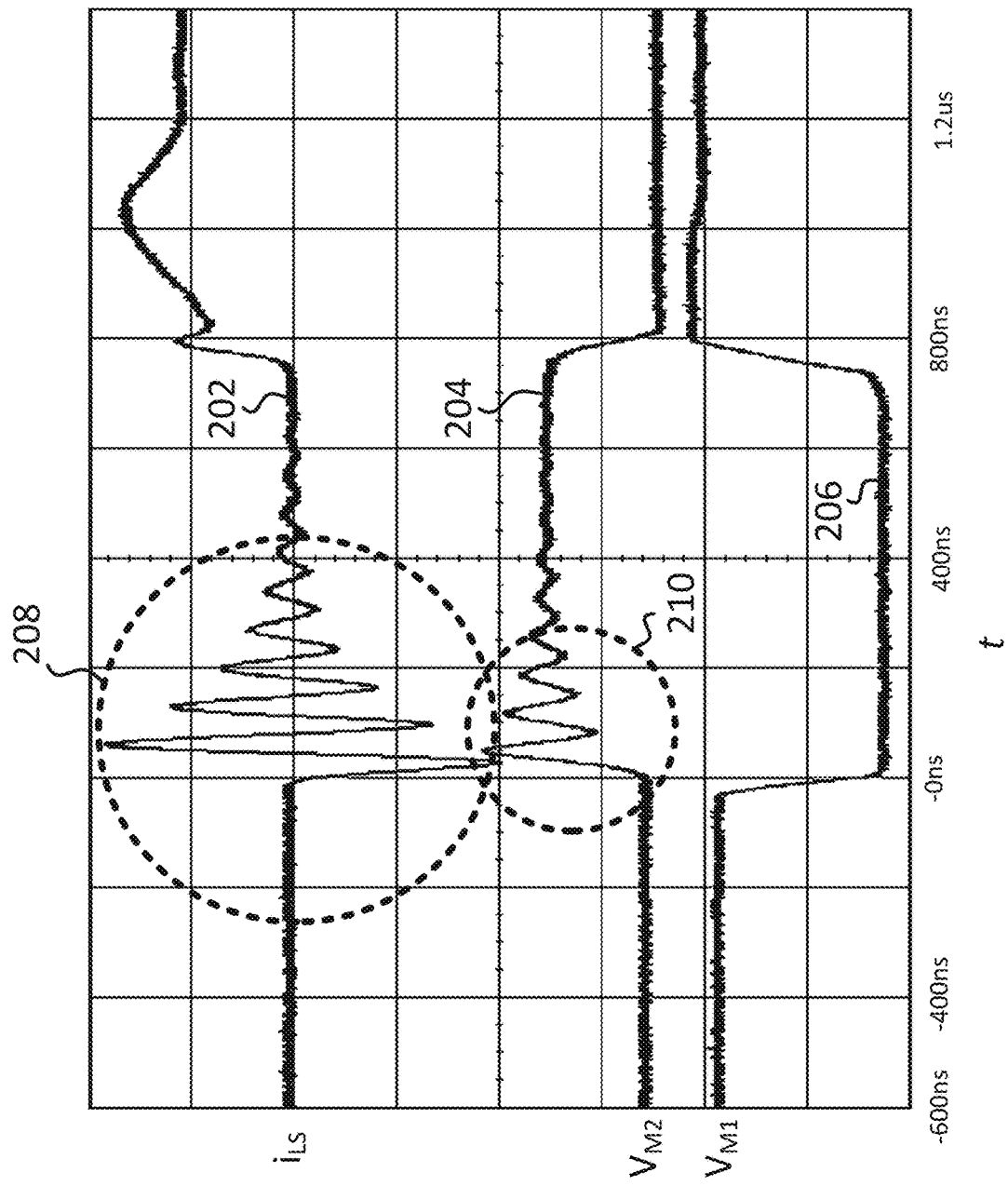
FIG. 2 shows simplified plots of signals related to operation of the power converter shown in FIG. 1, in accordance with some embodiments.

FIG. 2 shows simplified plots 200 of signals related to operation of the power converter 100 shown in FIG. 1 over a sample period during time t when a transition time of the primary-side switch M1 is not controlled to reduce a high-voltage spike at a drain node of the synchronous rectifier switch M2 of the power converter 100. Plot 202 is an example of a secondary-side leakage inductance current $i_{LS}$, plot 204 is an example of a drain-source voltage $V_{M2}$ at the drain node of the synchronous rectifier M2 (i.e., at the node 122), plot 206 is an example of a drain-source voltage VM1 at the drain node of the primary-side switch M1, the dashed circle 208 is a region of interest within the plot 202, and the dashed circle 210 is a region of interest within the plot 204. In the example shown by the plots 200, at time t=−600 ns the primary-side switch M1 is in an OFF-state, and the synchronous rectifier switch M2 is in an OFF-state. At approximately time t=0 ns, the primary-side switch M1 rapidly transitions to an ON-state (i.e., with a high slew rate). As shown in the region of interest 210, the rapid transition of the primary-side switch M1 excites the LC circuit 130 and thereby causes a high-voltage spike at the drain node of the synchronous rectifier switch M2 and subsequent high-frequency voltage ringing. The high-voltage spike may damage the synchronous rectifier switch M2, so in conventional solutions, the synchronous rectifier switch M2 is implemented using a large switch (e.g., a FET rated for 120V) that can withstand such high voltages. Such large switches however are often more expensive, have higher switching losses and require more board area to implement as compared to smaller switches.

Similarly, as shown in the region of interest 208, the rapid transition of the primary-side switch M1 excites the LC circuit 130 and thereby causes a high-current spike and subsequent high-frequency current ringing on the secondary-side of the power converter 100. The high-current ringing causes undesirable radiated and conducted EMI on the secondary-side of the power converter 100.

Figure 3:
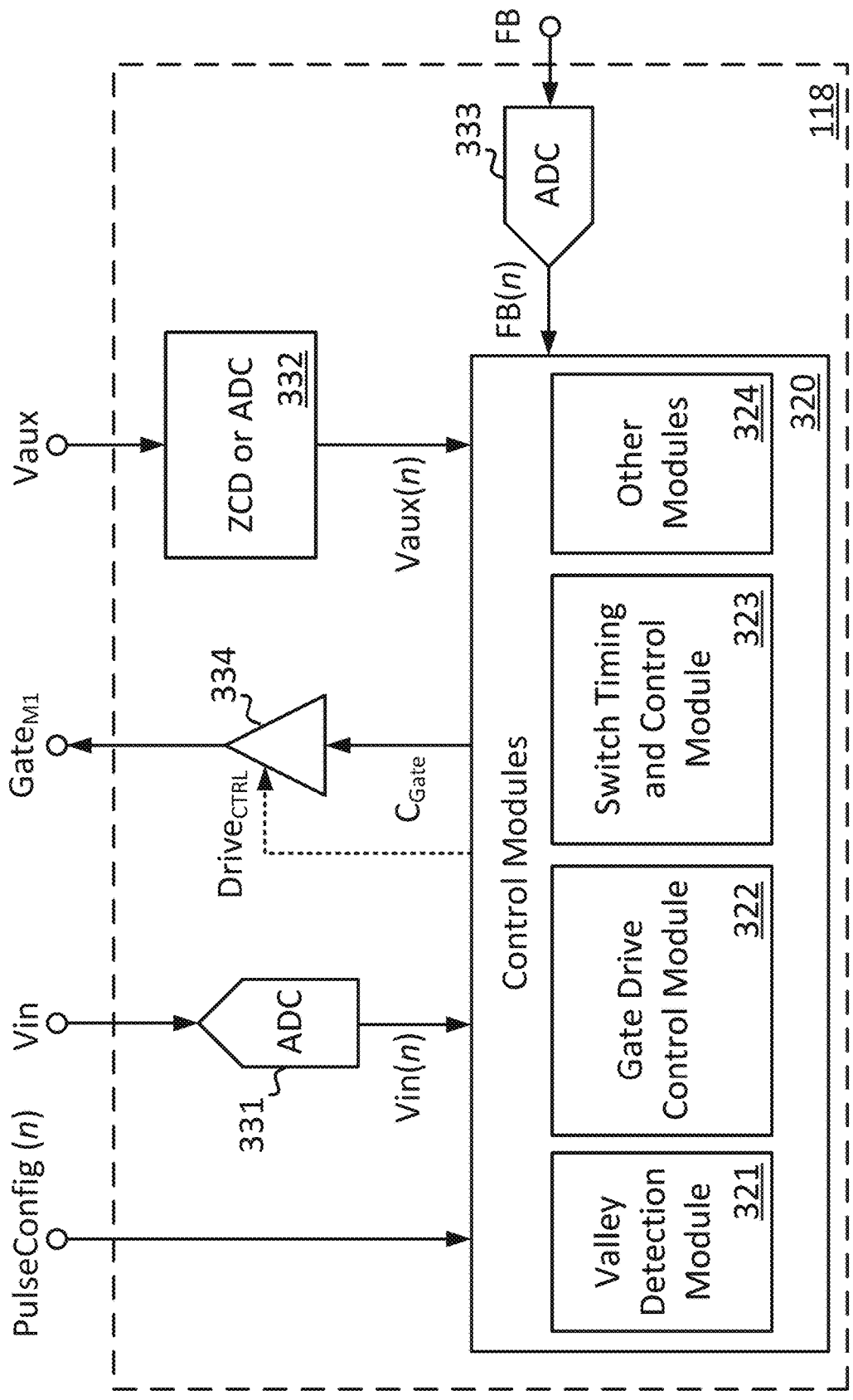
FIG. 3 is a simplified circuit schematic of a primary-side controller for use in the power converter shown in FIG. 1, in accordance with some embodiments.

FIG. 3 is a simplified circuit schematic of the primary-side controller 118 for use in the power converter shown in FIG. 1 to mitigate high-voltage spikes and subsequent ringing at the synchronous rectifier switch M2, in accordance with some embodiments. The primary-side controller 118 generally includes control modules 320, analog-to-digital converters (ADCs) 331 and 333, a zero-crossing detection or ADC circuit 332, and a gate driver circuit 334. The control modules 320 generally include a valley detection module 321, a gate drive control module 322, a switch timing and control module 323, and other modules 324. The primary-side controller 118 may include other circuits and modules that are not shown or described herein for simplicity but are understood to be present. Also shown are signals related to the operation of the power converter 100 and the primary-side controller 118 thereof, including PulseConfig(n), Vin, Gate$_{M1}$, Vaux, FB, Vin(n), Drive$_{CTRL}$, C$_{Gate}$, Vaux(n), and FB(n).

One or more of the control modules 320 are operable to receive the optional PulseConfig(n) signal that was first shown in FIG. 1. The PulseConfig(n) signal generally configures switch transition speed parameters for the primary-side switch M1 that may be used by the gate drive control module 322 and/or the switch timing and control module 323. For example, in some embodiments, PulseConfig(n) may specify any of a maximum switch transition speed, a minimum switch transition speed, and/or any intermediate switch transition speed for the primary-side switch M1.

In some embodiments, the switch transition speed parameters for the primary-side switch M1 used by the gate drive control module 322 are determined based on the primary-side switch M1 $C_{rss}$ (gate-to-drain) parasitic capacitance, which dictates how fast the drain-to-source voltage will fall (slew-rate) when the primary-side switch M1 is turned on. In such embodiments, a gate-source current drive strength $I_{GATE}^{SRC}$ for the primary-side switch M1 is determined such that $$I_{GATE}^{SRC} > \frac{C_{rss}^{@250V}}{100} \qquad \text{(Equation 1)}$$

where $C_{rss}$ is in pF and $I_{GATE}^{SRC}$ is in mA. The gate-source current drive strength $I_{GATE}^{SRC}$ corresponds to the switch transition speeds S1-S3 speed of the primary-side switch M1, where the switch transition speed S1 corresponds to a lowest gate-source current drive strength $I_{GATE}^{SRC}$, the switch transition speed S3 corresponds to a highest gate-source current drive strength $I_{GATE}^{SRC}$, and the switch transition speed S2 corresponds to a gate-source current drive strength $I_{GATE}^{SRC}$ that is in between that of switch transition speeds S1 and S3.

The ADC 331 receives Vin (shown in FIG. 1) and generates a digital representation Vin(n) thereof. The circuit 332 that implements either a zero-crossing-detection circuit (ZCD) or an ADC receives Vaux (shown in FIG. 1) and generates a valley detection signal Vaux(n) thereof. The ADC 333 receives the feedback signal FB and generates a digital representation FB(n) thereof. The digital representations Vin(n), Vaux(n), and FB(n) are received by one or more control modules of the control modules 320. The gate driver circuit 334 receives a primary-side switch control signal $C_{Gate}$ from the control modules 320 and generates a level-shifted, amplified, or otherwise conditioned primary-side gate control signal $GATE_{M1}$ shown in FIG. 1. For example, the primary-side switch control signal $C_{Gate}$ may include a sequence of logic-level pulses, and the primary-side gate control signal $GATE_{M1}$ may include a corresponding respective sequence of amplified or level-shifted pulses that are operable to control the gate node of the primary-side switch M1. In some embodiments, the gate drive control module 322 is operable to dynamically control a drive strength of the gate driver circuit 334 to thereby dynamically control a switch transition speed (i.e., a slew rate) of the primary-side switch M1.

The switch transition speed, or slew rate, of the primary-side switch M1 is a rate of change in the drain-source voltage $V_{M1}$ over time (i.e., in volts-per-second). Controlling a switch transition speed, or slew rate, of a switch, such as a FET or MOSFET, is well understood in the art. A switch transition speed of the primary-side switch M1 is controlled by the gate driver circuit 334 in accordance with a switch transition speed control signal $Drive_{CTRL}$ received by the gate driver circuit 334 from the gate drive control module 322. In some embodiments, the switch transition speed of the primary-side switch M1 is controlled by an adjustable drive strength of the gate driver circuit 334. In other embodiments, the switch transition speed of the primary-side switch M1 is controlled by adjusting an adjustable resistance and/or an adjustable capacitance of a portion of the gate driver circuit 334 that is electrically connected to the gate node of the primary-side switch M1.

The switch timing and control module 323 is operable to generate the primary-side switch control signal $C_{Gate}$ to control an ON-time and an OFF-time of the primary-side switch M1, via the gate driver circuit 334, to control a power transfer from the primary-side of the power converter 100 to the secondary-side of the power converter 100 based on the digital representation of the feedback signal FB(n). Additionally, the switch timing and control module 323 is operable to determine and/or select an operating mode of the power converter 100 based on the digital representations Vin(n), Vaux(n), and FB(n). As described below with reference to FIGS. 6-9, the gate drive control module 322 is advantageously operable to control a switch transition speed of the primary-side switch M1 using the switch transition speed control signal $Drive_{CTRL}$ transmitted therefrom to the gate driver circuit 334. As disclosed herein, the switch transition speed of the primary-side switch M1 is advantageously configured based not only on an operating mode of the power converter 100, but is also on which pulse in a particular pulse sequence is to be generated the gate driver circuit 334.

Multiple switch transition speeds S1-S3 of the primary-side switch M1 are discussed with respect to the step of FIGS. 6-9. Each of the switch transitions speeds S1-S3 is indicative of a transition time in volts-per-second of the primary-side switch M1. The switch transition speed S1 indicates a slowest switch transition speed of the primary-side switch M1 for the range S1-S3, the switch transition speed S3 indicates the fastest switch transition speed of the primary-side switch M1, and the switch transition speed S2 indicates a switch transition speed of the primary-side switch that is faster than S1 and slower than S3 (i.e., a medium switch transition speed). As discussed above, in some embodiments, the actual switch transition speeds that correspond to one or more of S1-S3 may be configured by the digital pulse configuration signal PulseConfig(n) signal. In some embodiments, S1 ranges from 100-200 ns, S2 ranges from 50-100 ns and S3 ranges from 10-50 ns.

Figure 4:
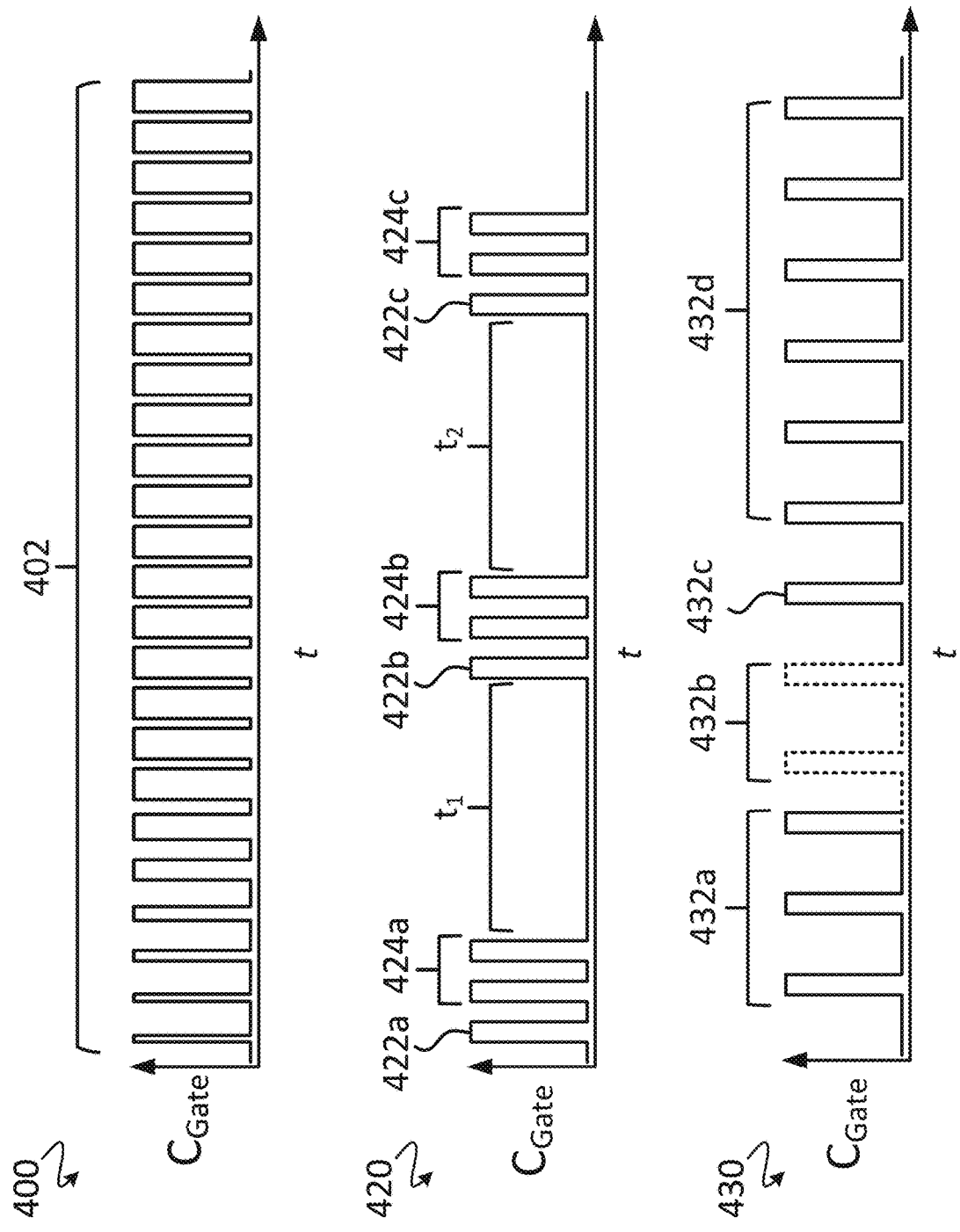
FIGS. 4-5 show simplified plots of signals related to operation of the power converter shown in FIG. 1, in accordance with some embodiments.

FIG. 4 shows simplified example plots 400, 420, and 430 of the primary-side switch control signal $C_{Gate}$ generated by the switch timing and control module 323 during different operating modes of the power converter 100, in accordance with some embodiments. In the example shown, an asserted level of the primary-side switch control signal $C_{Gate}$ signal sets the primary-side switch M1, via the gate driver circuit 334, to an ON-state and a de-asserted level of the primary-side switch control signal $C_{Gate}$ sets the primary-side switch M1 to an OFF-state. However, as is understood in the art, the levels of the primary-side switch control signal $C_{Gate}$ could be inverted in some embodiments.

The example plot 400 illustrates an example start-up mode switching sequence or a continuous conduction mode (CCM) switching sequence of the power converter 100. In the example plot 400, pulses 402 of the primary-side switch control signal $C_{Gate}$ are generated as a pulse-width-modulation (PWM) sequence in which a switching frequency of the primary-side switch control signal $C_{Gate}$ remains substantially constant and a duty-cycle thereof is adjusted based on a digital representation of the feedback signal FB(n).

The example plot 420 illustrates an example burst-mode switching sequence of the power converter 100, i.e. when operating in a discontinuous conduction mode (DCM) under light or no-load conditions. Pulse 422a represents one or more initial pulses of a first burst sequence and pulses 424a are one or more subsequent pulses of the first burst sequence. Similarly, pulse 422b represents one or more initial pulses of a second burst sequence, and pulses 424b are one or more subsequent pulses of the second burst sequence. Pulse 422c represents one or more initial pulses of a third burst sequence and pulses 424c are one or more subsequent pulses of the third burst sequence. Durations $t_1$ and $t_2$ are example durations of time during which one or more switching cycles are skipped or blanked and therefore no pulses are generated.

The example plot 430 illustrates an example skip-pulse mode switching sequence of the power converter 100, i.e., when operating in a discontinuous conduction mode (DCM) under light or no-load conditions. The example plot 430 includes generated pulses 432a, skipped pulses 432b, one or more initial pulses 432c of a skip-pulse sequence, and one or more subsequent pulses 432d of the skip-pulse sequence. In the example plot 430, pulses 432b representing one or more pulses that would be otherwise asserted during fixed-frequency PWM switching sequence are "skipped". Skipping pulses reduces a power transfer level from the primary-side of the power converter 100 to the secondary-side to a level below which a minimum ON-time of the primary-side switch control signal $C_{Gate}$ could achieve via fixed-frequency PWM control. Pulse 432c is a first pulse of a skip-pulse sequence that is generated after the skipped pulses 432b. Pulses 432d are subsequent pulses of the skip-pulse sequence that are generated after the first pulse 432c. The simplified example plots 400, 420, and 430 are referred to again below with reference to FIGS. 6-9.

Figure 5:
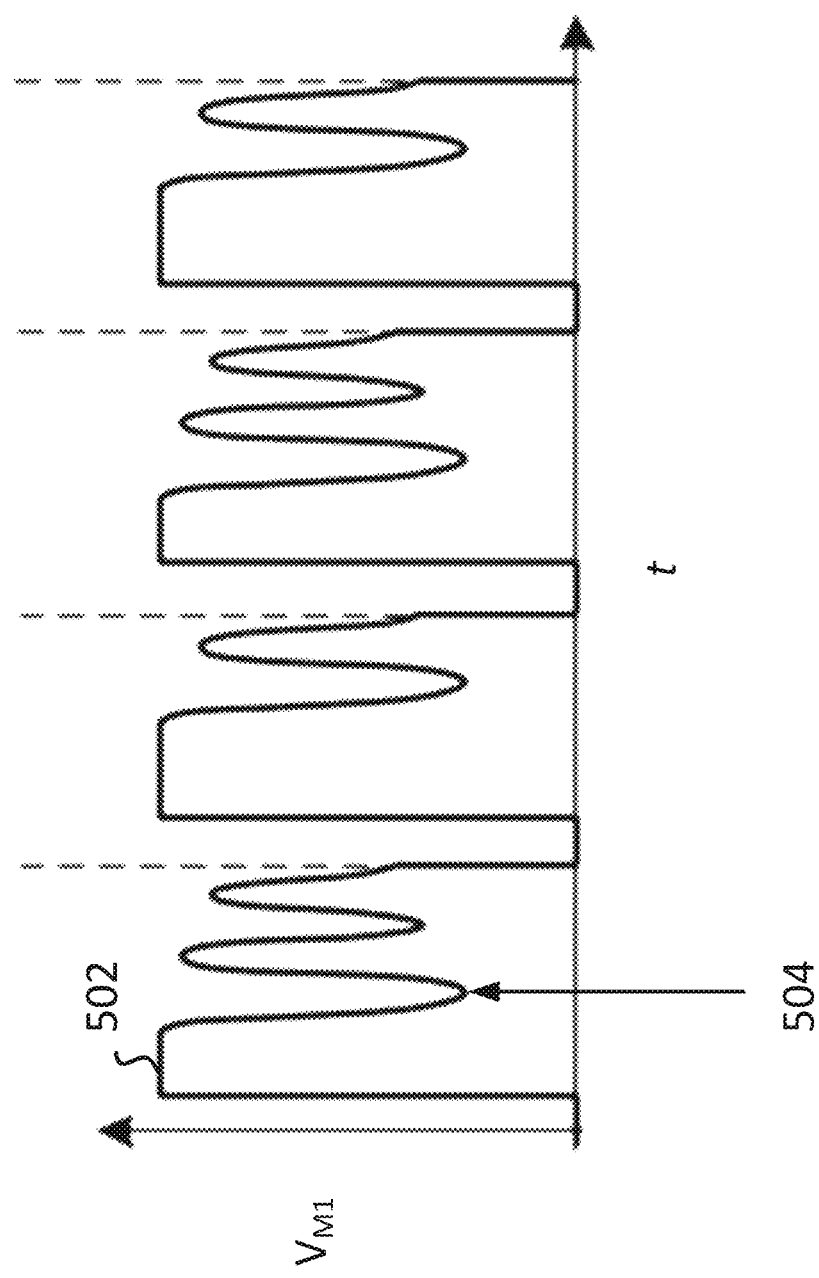

FIG. 5 shows a simplified example plot 502 of the drain-source voltage $V_{M1}$ of the primary-side switch M1 during a quasi-resonant operating mode of the power converter 100, in accordance with some embodiments. During a quasi-resonant operating mode of the power converter 100 energy stored in the primary-side switch M1 output capacitance is completely discharged during a switching sequence of the primary-side switch M1. A resonant valley 504 may be detected by primary-side controller 118 using the valley detection signal Vaux(n) that is based on the auxiliary voltage at the auxiliary winding 119 of the transformer 102. The occurrence of a resonant valley is indicative of the energy stored in the primary-side switch M1 output capacitance having been completely discharged. In some embodiments, the circuit 332 includes an ADC circuit and the valley detection signal Vaux(n) is a digital representation of the auxiliary voltage at the auxiliary winding 119, generated by the ADC circuit. In such embodiments, the resonant valley is detected by the valley detection module 321 based on a characteristic of the digital representation of the auxiliary voltage (e.g., by identifying slopes, inflection points, local minima and maxima, etc.). In other embodiments, the circuit 332 includes a ZCD circuit and the valley detection signal Vaux(n) is a signal output from the ZCD circuit that is based on the auxiliary voltage at the auxiliary winding 119. In such embodiment, the resonant valley is detected by the valley detection module 321 based on a sequence of signal level transitions from the ZCD circuit.

Figure 6:
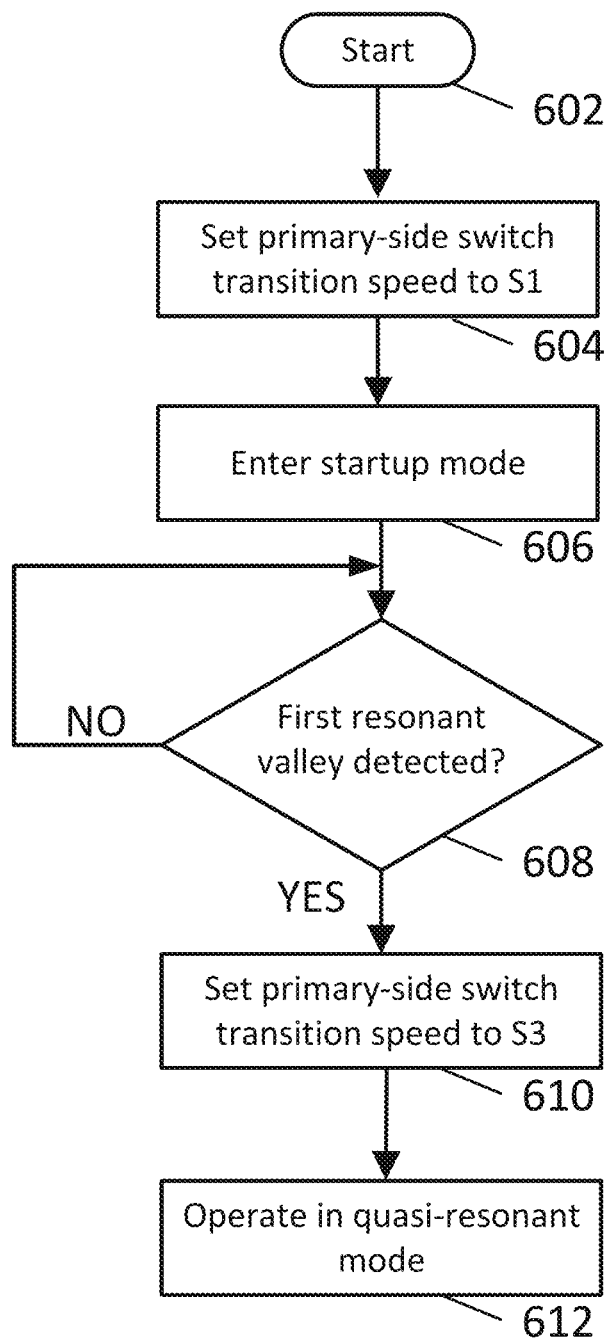
FIGS. 6-9 show portions of an example process for operation of the power converter shown in FIG. 1, in accordance with some embodiments.

FIG. 6 shows a simplified portion of an example process 600 for operation of the power converter 100 shown in FIG. 1, in accordance with some embodiments. The particular steps, order of steps, and combination of steps are shown for illustrative and explanatory purposes only. Other embodiments can implement different particular steps, orders of steps, and combinations of steps to achieve similar functions or results.

At step 602, operation of the power converter begins (e.g., the voltage Vin' is applied to the input voltage filter block 115). As part of step 602, the switch timing and control module 323 may determine that operation of the power converter 100 has begun and directs the gate drive control module 322 to set the switch transition time of the primary-side switch M1 to a low speed. Accordingly, at step 604, the gate drive control module 322 sets a switch transition speed of the primary-side switch M1 to a first speed S1 (i.e., the slowest speed of the primary-side switch transition speeds S1-S3). At step 606, the power converter 100 enters startup mode, during which the switch timing and control module 323 may generate the primary-side switch control signal $C_{Gate}$ as a fixed frequency PWM signal with an incrementing duty-ratio value (e.g., as shown in the initial pulses of the plot 400 of FIG. 4), thereby rapidly increasing an ON-time of the primary-side switch M1 so that components of the power converter 100 may power-up quickly. During the startup mode of operation, the power converter 100 may be operating in a continuous current mode of operation, whereby the transformer 102 is not fully discharged during each switching cycle. As such, the primary-side switch transition speed was set to the slowest (of the range S1-S3) switch transition speed S1 because the residual energy stored in the primary-side switch M1 output capacitance when the primary-side switch M1 turns on creates a larger voltage step at the resonant secondary-side LC circuit 130 as compared to if there was less, or no, residual energy stored in the primary-side switch M1 output capacitance. By transitioning the primary-side switch to the ON-state using the slowest switch transition speed S1 during times that the transformer 102 retains significant residual energy throughout the switching cycle, the step response at the resonant secondary-side LC circuit 130 when the primary-side switch transitions to an ON-state is reduced, and consequently, the resulting high-voltage spike and high-frequency ringing at the synchronous rectifier switch M2 is advantageously reduced.

At step 608, the valley detection module 321 determines (e.g., using the valley detection signal Vaux(n)) if a first resonant valley has occurred at the drain node of the primary-side switch M1. An example of a first resonant valley 504 was described above with reference to FIG. 5. The occurrence of resonant valleys at the drain node of the primary-side switch M1 indicates that energy stored by primary-side switch M1 output capacitance is being significantly drained during the switching cycle and therefore does not retain significant residual energy when the primary-side switch M1 transitions to an ON-state. If the first resonant valley has not yet occurred, the power converter 100 remains in startup mode, and flow returns to step 608. If, however, it is determined at step 608 that a first resonant valley has occurred at the drain node of the primary-side switch M1, flow continues to step 610. The occurrence of the first resonant valley, detected at step 608, indicates that the power converter 100 can begin operating in a quasi-resonant mode. Quasi-resonant control methods induce a resonant waveform having sinusoidal voltage oscillations at the drains of one or more semiconductor switches of the power converter 100. Through well-timed control actions, a semiconductor switch (i.e., the primary-side switch M1) is turned on at the instants where the drain voltage is at a minimum (i.e., valley switching).

Thus, at step 610, the gate drive control module 322 sets a switch transition speed of the primary-side switch M1 to a third speed S3 (i.e., the fastest speed of the primary-side switch transition speeds S1-S3). That is, because there is less energy stored in the primary-side switch M1 output capacitance when the primary-side switch M1 is transitioned to an ON state as compared to during startup and/or CCM operation, a correspondingly smaller voltage step occurs at the resonant secondary-side LC circuit 130. After the switch transition speed is set to the third speed S3, at step 612, the power converter 100 operates in a quasi-resonant mode in which the output voltage Vout is advantageously regulated using valley-switching.

Figure 7:
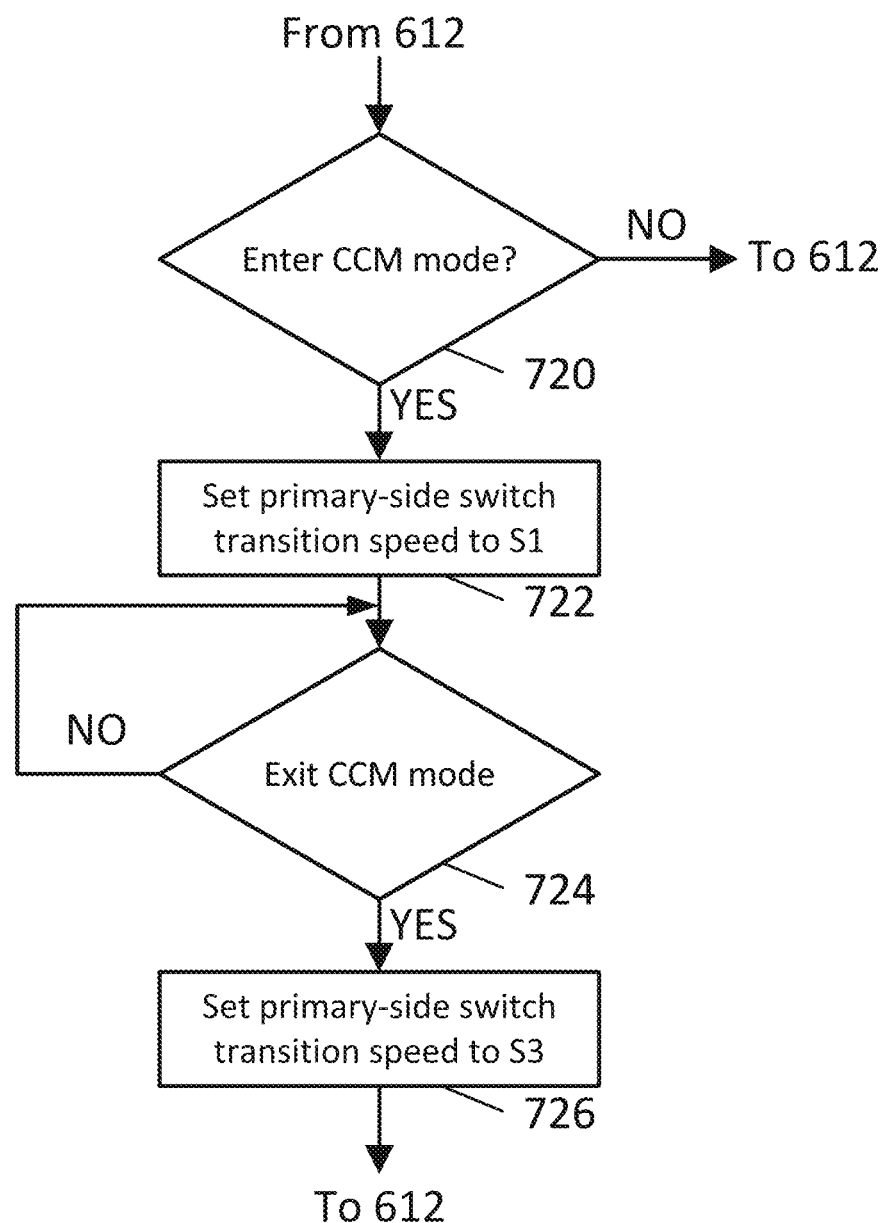

FIG. 7 shows a simplified portion of an example process 700 for operation of the power converter 100 shown in FIG. 1, in accordance with some embodiments. The particular steps, order of steps, and combination of steps are shown for illustrative and explanatory purposes only. Other embodiments can implement different particular steps, orders of steps, and combinations of steps to achieve similar functions or results.

At step 720, it is determined by the switch timing and control module 323 if the operation of the power converter 100 is entering (or is operating in) a continuous conduction mode (CCM). For example, the power converter 100 may transition from the quasi-resonant mode of operation at step 612 to a continuous conduction mode of operation if the amount of power delivered by the power converter 100 to the load $R_L$ is such that the power converter 100 is still able to regulate the output voltage Vout with a fixed frequency PWM signal, but energy stored in the transformer 102 is not fully discharged each switching cycle. If it is determined at step 720 that the power converter 100 is not entering or operating in continuous conduction mode, the flow returns to step 612 shown in FIG. 6. If, however, it is determined at step 720 that the power converter 100 is entering or operating in a continuous conduction mode, the flow continues to step 722. As explained above with respect to FIG. 6, when the power converter 100 is operating in a continuous conduction mode, residual energy stored in the primary-side switch M1 output capacitance may cause a high-voltage spike and subsequent high-frequency current ringing at the resonant secondary-side LC circuit 130. Thus, at step 722, the gate drive control module 322 sets a switch transition speed of the primary-side switch M1 to a first speed S1 (i.e., the slowest speed of the primary-side switch transition speeds S1-S3) to reduce the amplitude of the high-voltage spike at the drain node of the synchronous rectifier switch M2.

At step 724 it is determined by the switch timing and control module 323 if the power converter 100 is exiting, or has exited, continuous conduction mode. If it is determined at step 724 that the power converter 100 has not exited, or is not exiting continuous conduction mode, the flow remains at step 724. However, if it is determined at step 724 that the power converter 100 is exiting, or has exited, continuous conduction mode, then the gate drive control module 322 sets the switch transition speed of the primary-side switch M1 back to the third speed S3 (i.e., the fastest speed of the primary-side switch transition speeds S1-S3). After step 726, the flow returns to step 612 shown in FIG. 6.

Can we create an additional case similar to FIG. 7 for the case where low output voltage is detected (for example in PD application with 5 to 20V output voltage range, 5V). When it is detected we would select the slowest drive strength since the spike on M2 is increased for this case as well. The output voltage can be detected using the VAUX voltage (output is reflected on auxiliary winding when M2 is on).

Figure 8:
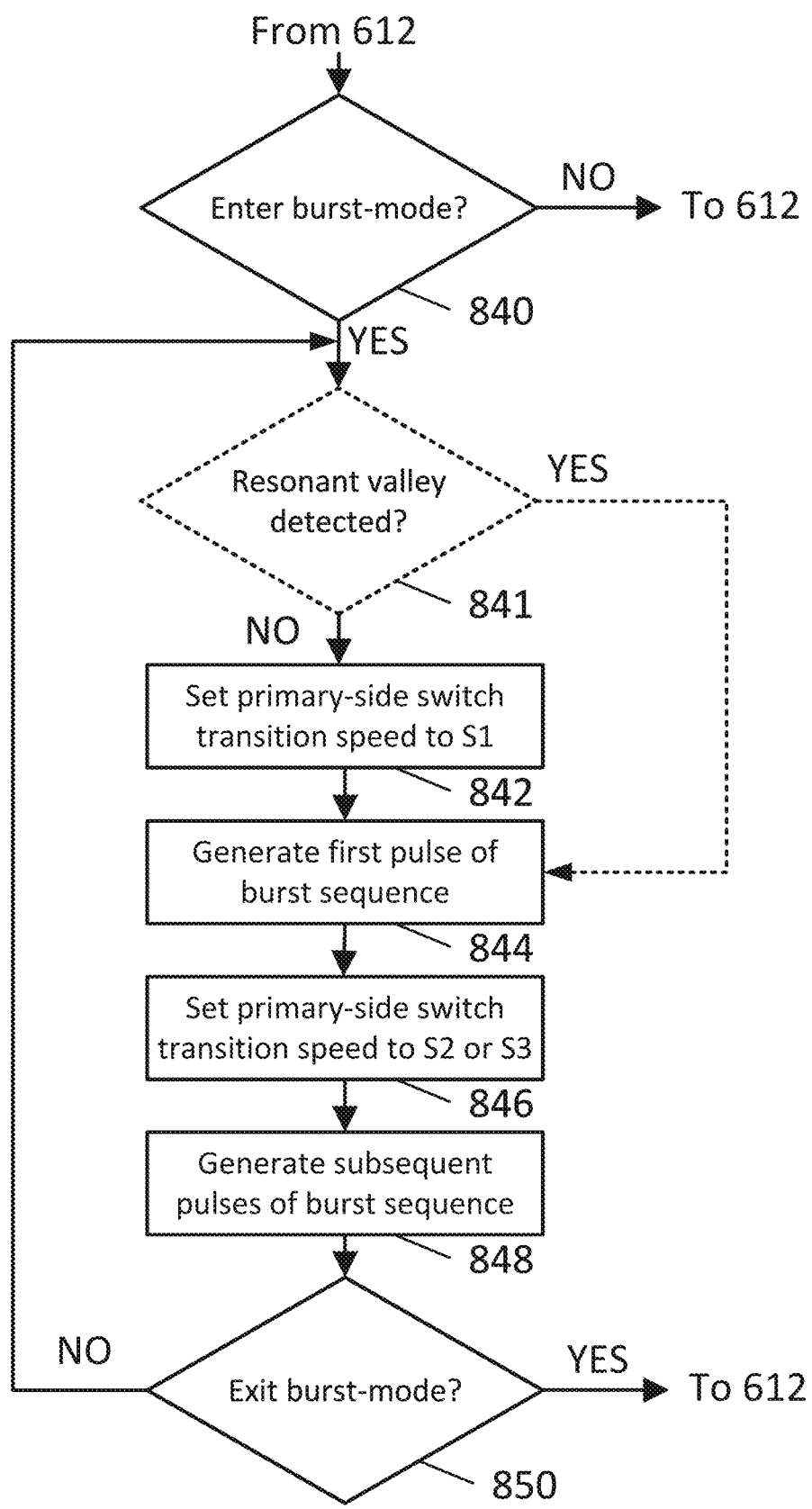

FIG. 8 shows a simplified portion of an example process 800 for operation of the power converter 100 shown in FIG. 1, in accordance with some embodiments. The particular steps, order of steps, and combination of steps are shown for illustrative and explanatory purposes only. Other embodiments can implement different particular steps, orders of steps, and combinations of steps to achieve similar functions or results.

At step 840, it is determined by the switch timing and control module 323 if the operation of the power converter 100 is entering (or is operating in) burst-mode. An example burst-mode gate control timing diagram is shown in the plot 420 of FIG. 4. The power converter 100 may operate in burst-mode when the power delivered to the load $R_L$ is of such a low level (e.g., due to a light-load, an ultra-light load, or no load) that a maximum off-time of the primary-side switch M1 during normal fixed-frequency PWM regulation of the primary-side switch control signal $C_{Gate}$ still delivers too much power to the secondary-side of the power converter 100. As shown in the plot 420, during burst-mode operation, the power converter 100 generates a first sequence of pulses that includes 422a and 424a, generates no pulses for a first duration of time $t_1$, generates a second sequence of pulses that includes 422b and 424b, generates no pulses for a second duration of time $t_2$, generates a third sequence of pulses that includes 422c and 424c, and so on. The durations of times (e.g., $t_1$ and $t_2$) during which the primary-side switch M1 remains off allows the power converter 100 to further reduce how much power is delivered to the secondary-side beyond which a maximum off-time of the fixed-frequency PWM signal would allow. In some embodiments, optional step 841 follows step 840. At step 841, it is determined by the valley detection module 321 if a resonant valley has been detected at the drain node of the primary-side switch M1 before the first pulse of the burst-sequence is to be generated at step 844. Detection of a resonant valley indicates that there is less energy stored in the primary-side switch M1 output capacitance than if no resonant valley was detected. If it is determined at step 841 that a resonant valley was detected at the drain node of the primary-side switch M1, the flow of the process may advantageously flow directly to step 844 without adjusting a switch transition speed of the primary-side switch M1. However, if no resonant valley was detected at the drain node of the primary-side switch M1 at step 841, flow continues to step 842. Because there is residual energy stored in the primary-side switch M1 output capacitance, the first pulse of a burst sequence after the duration of time during which the primary-side switch M1 has remained off may cause a larger voltage spike at the synchronous rectifier switch M2 as compared to that caused by subsequent pulses of the burst sequence. For example, with reference to the plot 420 shown in FIG. 4, the first pulse 422b of the primary-side switch control signal $C_{Gate}$ that occurs after the duration of time $t_1$ may cause a larger voltage spike and subsequent high-frequency ringing on the secondary-side of the power converter 100 as compared to the subsequent pulses 424b of that burst sequence. Therefore, at step 842 of FIG. 8, the switch transition speed of the primary-side switch M1 is advantageously set by the gate drive control module 322 to the lowest switch transition speed S1 of the range S1-S3 to reduce the amplitude of the voltage spike at the synchronous-rectifier switch M2. At step 844, a first pulse of the burst sequence (e.g., any of 422a, 422b, or 422c shown in FIG. 4) is generated by the gate driver circuit 334 using the lowest switch transition speed S1.

At step 846, because the subsequent pulses of the burst sequence do not cause large voltage spikes at the synchronous-rectifier switch M2 as compared to the first pulse of the burst sequence, the switch transition speed of the primary-side switch M1 is advantageously set to a switch-speed that is faster than S1 (e.g., S2 or S3) such that a power-processing efficiency of the power converter 100 is increased as compared to that of a power converter that continued to use the lowest switch transition speed S1 for the subsequent pulses of the burst sequence.

At step 848, the subsequent pulses of the respective burst sequence (e.g., any of 424a, 424b, or 424c, respectively) are generated by the gate driver circuit 334 using the switch transition speed that is faster than S1. At step 850, it is determined by the switch timing and control module 323 if the operation of the power converter 100 is exiting (or has exited) burst-mode operation. If it is determined at step 850 that the power converter 100 has not exited, or is not exiting, burst-mode operation, the flow returns to step 841. It is determined at step 850 that the power converter 100 is exiting, or has exited, burst-mode operation, the flow returns to step 612 shown in FIG. 6.

Figure 9:
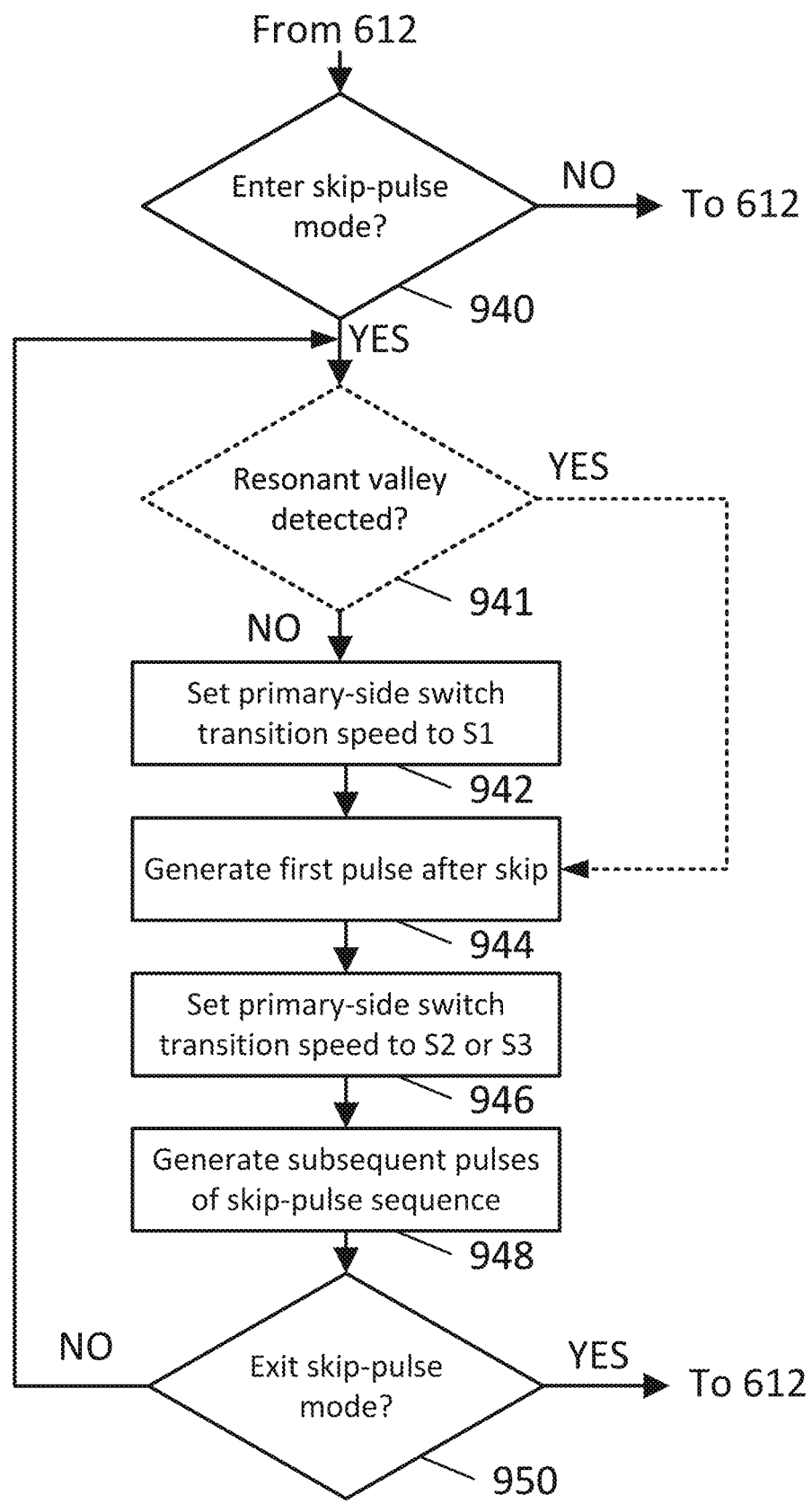

FIG. 9 shows a simplified portion of an example process 900 for operation of the power converter 100 shown in FIG. 1, in accordance with some embodiments. The particular steps, order of steps, and combination of steps are shown for illustrative and explanatory purposes only. Other embodiments can implement different particular steps, orders of steps, and combinations of steps to achieve similar functions or results.

At step 940, it is determined by the switch timing and control module 323 if the operation of the power converter 100 is entering (or is operating in) skip-pulse mode. An example skip-pulse gate control timing diagram is shown in the plot 430 of FIG. 4. Similar to burst-mode, the power converter 100 may operate in skip-pulse mode when the power delivered to the load $R_L$ is of such a low level (e.g., due to a light-load, an ultra-light load, or no load) that a maximum off-time of the primary-side switch M1 during normal fixed-frequency PWM regulation of the primary-side switch control signal $C_{Gate}$ still delivers too much power to the secondary-side of the power converter 100. As shown in the plot 430, during skip-pulse mode operation, the power converter 100 generates a first sequence of pulses that includes pulses 432a, skips the generation of the one or more pulses 432b, generates a first pulse 432c after the skipped pulses 432b, generates the subsequent pulses 432d of that skip-pulse sequence, and so on. The skipped pulses 432b during which the primary-side switch M1 remains off allow the power converter 100 to further reduce how much power is delivered to the secondary-side beyond which a maximum off-time of the fixed-frequency PWM signal would allow. However, the first pulse 432c after the skipped pulses 432b may cause a larger voltage spike at the synchronous rectifier switch M2 as compared to that caused by subsequent pulses 432d of the skip-pulse sequence.

In some embodiments, optional step 941 follows step 940. At step 941, it is determined by the valley detection module 321 if a resonant valley has been detected at the drain node of the primary-side switch M1 before the first pulse of the skip-pulse sequence is to be generated at step 944. Detection of resonant valley indicates that there is less energy stored in the primary-side switch M1 output capacitance than if no resonant valley was detected. If it is determined at step 941 that a resonant valley was detected at the drain node of the primary-side switch M1, flow of the process 900 may advantageously flow directly to step 944 (i.e., without adjusting a switch transition speed of the primary-side switch M1). However, if no resonant valley was detected at the drain node of the primary-side switch M1 at step 941, flow continues to step 942.

Because there is residual energy stored in the primary-side switch M1 output capacitance, the first pulse of a skip-pulse sequence after the skipped-pulses during which the primary-side switch M1 has remained off may cause a larger voltage spike at the synchronous rectifier switch M2 as compared to that caused by subsequent pulses of the skip-pulse sequence. Therefore, at step 942 of FIG. 9, the switch transition speed of the primary-side switch M1 is advantageously set to the lowest switch transition speed S1 of the range S1-S3 to reduce the amplitude of the voltage spike at the synchronous-rectifier switch M2. At step 944, the first pulse 432c after the skipped pulses 432b is generated by the gate driver circuit 334 using the lowest switch transition speed S1.

At step 946, because the subsequent pulses of the skip-pulse sequence do not cause large voltage spikes at the synchronous-rectifier switch M2 as compared to the first pulse of the skip-pulse sequence, the switch transition speed of the primary-side switch M1 is advantageously set to a switch-speed that is faster than S1 (e.g., S2 or S3) such that a power-processing efficiency of the power converter 100 is increased as compared to that of a power converter that continued to use the lowest switch transition speed S1 for the subsequent pulses of the skip-pulse sequence.

At step 948, the subsequent pulses 432d of the respective skip-pulse sequence are generated by the gate driver circuit 334 using the switch transition speed that is faster than S1. At step 950, it is determined by the switch timing and control module 323 if the operation of the power converter 100 is exiting (or has exited) the skip-pulse mode of operation. If it is determined at step 950 that the power converter 100 has not exited, or is not exiting, the skip-pulse mode of operation, the flow returns to step 941. If it is determined at step 950 that the power converter 100 is exiting, or has exited, the skip-pulse mode of operation, flow returns to step 612 shown in FIG. 6.

Figure 10:
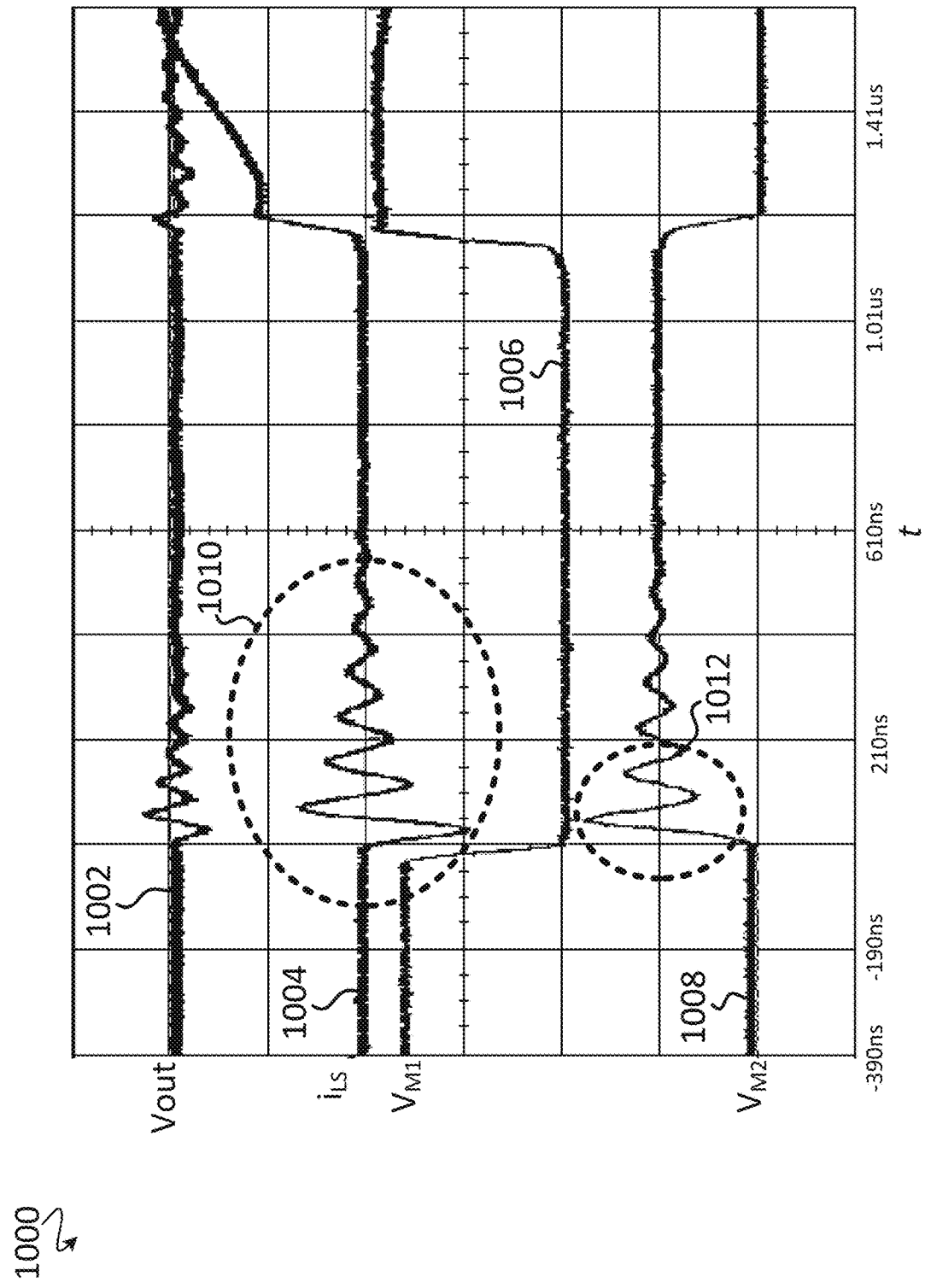
FIGS. 10-17 show simplified plots of signals related to operation of the power converter shown in FIG. 1, in accordance with some embodiments.

FIG. 10 shows simplified plots 1000 of signals related to experimental results for a power converter that is similar to the power converter 100 shown in FIG. 1 over time t when a switch transition time of the primary-side switch M1 is not controlled to reduce a high-voltage spike and subsequent high-frequency ringing on the secondary-side of the power converter 100, in accordance with some embodiments. In the example shown, Vin is 230 Vac, Vout is 5V, and the load $R_L$ is 0 Ohms. A measured voltage amplitude of Vout at the node 124 is shown in plot 1002. A measured current amplitude of a secondary-side leakage inductance current $i_{LS}$ through the node 122 is shown in plot 1004. A measured voltage amplitude at the drain node of the primary-side switch M1 at the node 110 is shown in plot 1006, and a measured voltage amplitude at the drain node of the synchronous rectifier M2 at the node 122 is shown in plot 1008. As was discussed above with FIG. 2, a rapid transition of the primary-side switch M1 excites the LC circuit 130 shown in FIG. 1, thereby causing an undesirable high-voltage spike at the drain node of the synchronous rectifier switch M2, shown in the region of interest 1012 and subsequent high-frequency current ringing, shown in the region of interest 1010, on the secondary-side of the power converter 100.

Figure 11:
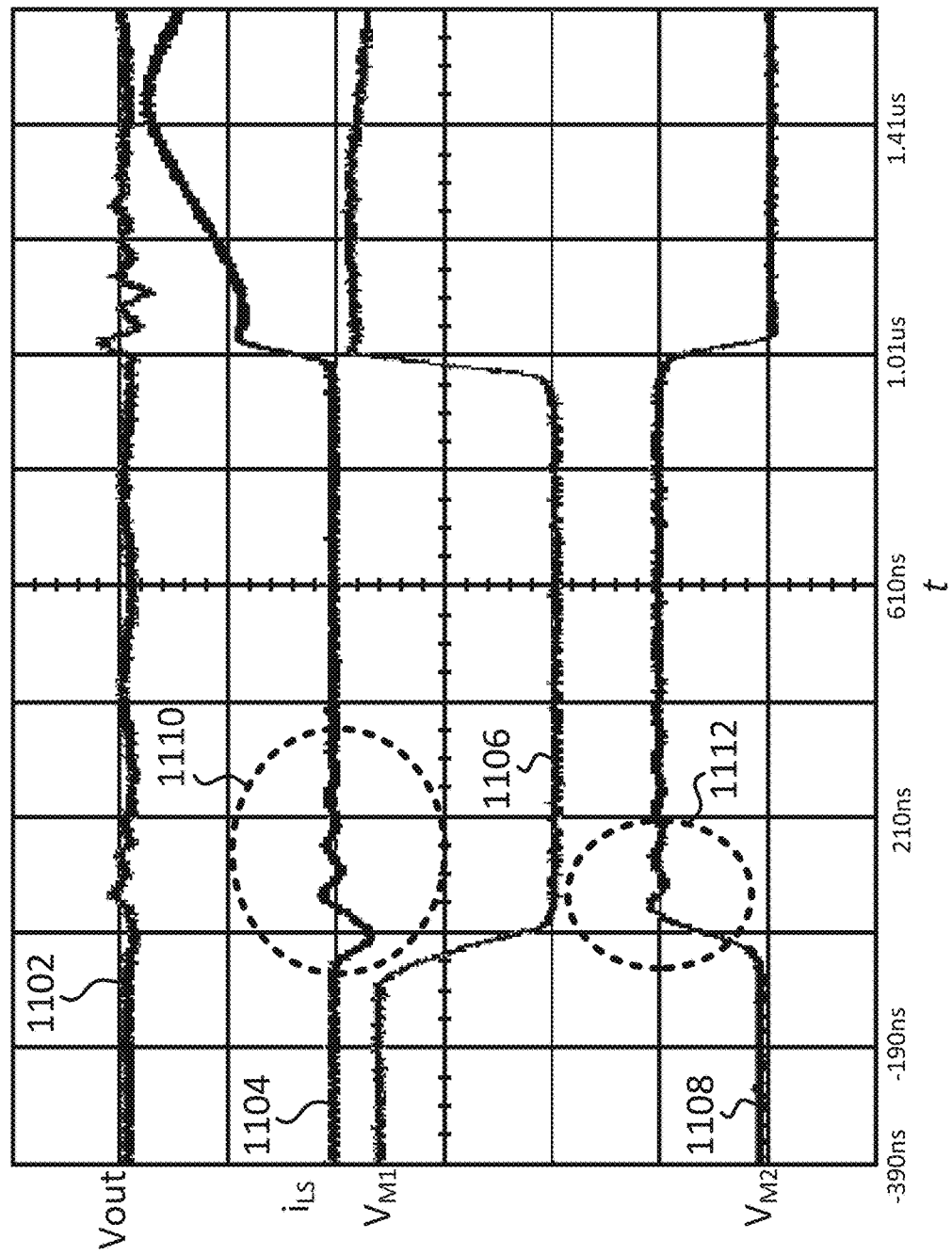

By comparison, FIG. 11 shows simplified plots 1100 of signals related to experimental results for a power converter that is similar to the power converter 100 shown in FIG. 1 over time t when a transition time of the primary-side switch M1 is controlled as disclosed herein to reduce a high-voltage spike and subsequent high-frequency ringing on the secondary-side of the power converter 100, in accordance with some embodiments. In the example shown, Vin is 230 Vac, Vout is 5V, and the load $R_L$ is 0 Ohms. A measured voltage amplitude of Vout at the node 124 is shown in plot 1102. A measured current amplitude of a secondary-side leakage inductance current $i_{LS}$ through the node 122 is shown in plot 1104. A measured voltage amplitude at the drain node of the primary-side switch M1 at the node 110 is shown in plot 1106, and a measured voltage amplitude at the drain node of the synchronous rectifier M2 at the node 122 is shown in plot 1108. As shown in the plot 1106, a switch-transition time of the primary-side switch M1 is slower than a switch-transition time of the primary-side switch M1 shown in the plot 1006 of FIG. 6. As a result, the slower transition of the primary-side switch M1 causes a significantly lower amplitude high-voltage spike at the drain node of the synchronous rectifier switch M2, shown in the region of interest 1112 as compared to that shown in the region of interest 1012 of FIG. 10. Similarly, subsequent high-frequency current ringing, shown in the region of interest 1110, on the secondary-side of the power converter 100 is significantly decreased as compared to that shown in the region of interest 1010 shown in FIG. 10. In the example shown, a peak voltage amplitude of the high-voltage spike at the region of interest 1112 is 55V as compared to a peak voltage amplitude of 88V shown in the region of interest 1012 in FIG. 10. Similarly, in the example shown, a peak current amplitude of the high-current spike at the region of interest 1110 is 1.6 A as compared to a peak current amplitude of 5 A shown in the region of interest 1010 in FIG. 10.

Figure 12:
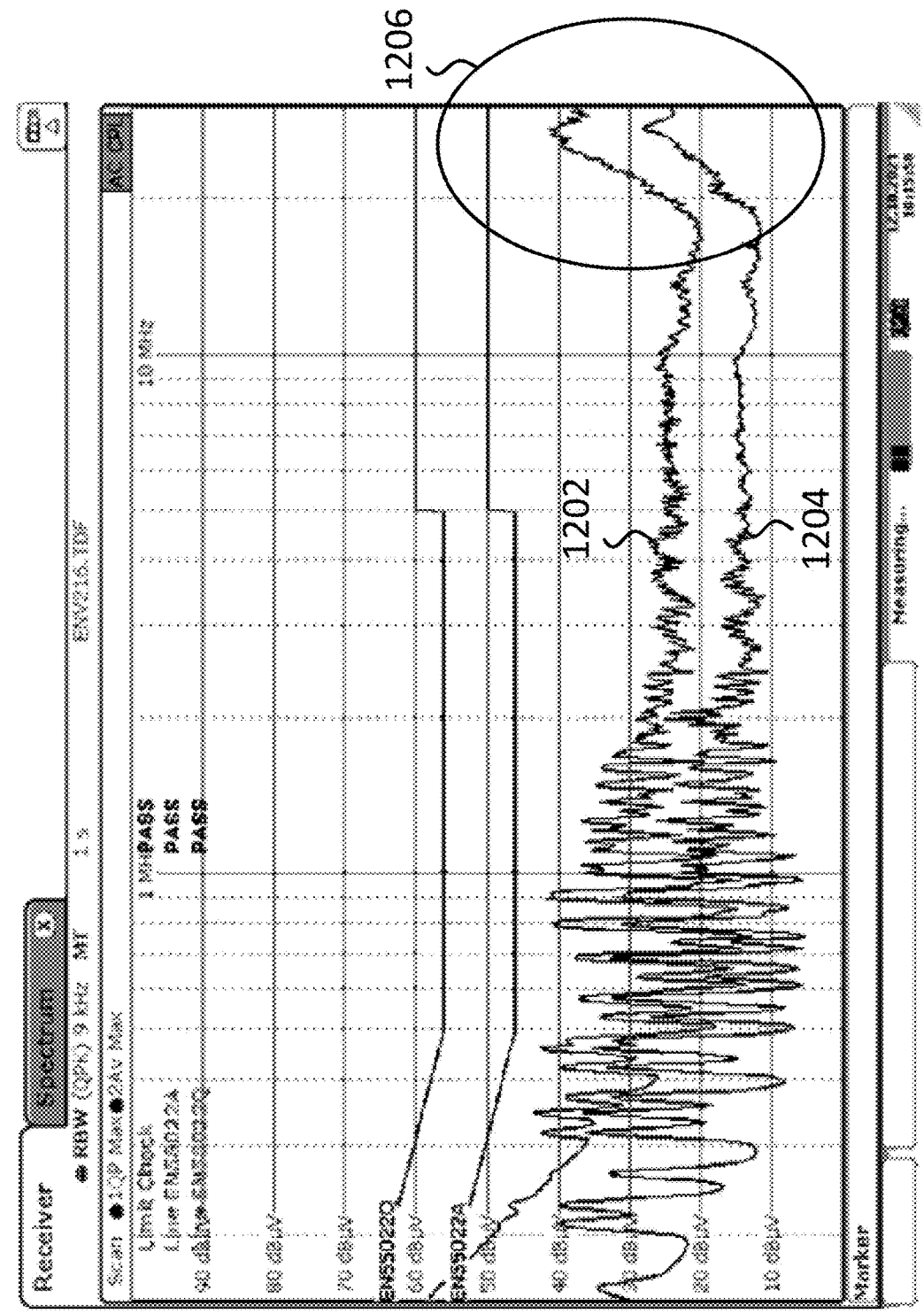

FIG. 12 shows a frequency spectrum plot 1200 of conducted EMI for a power converter that is similar to the power converter 100 shown in FIG. 1 when the primary-side switch M1 is transitioned using transition speed S1, in accordance with some embodiments. Plot 1202 shows a quasi-peak measurement of the conducted EMI, plot 1204 shows an average measurement of the conducted EMI, and a region of interest 1206 highlights the measured conducted EMI within the frequency range of 20 MHz to 30 MHz.

Figure 13:
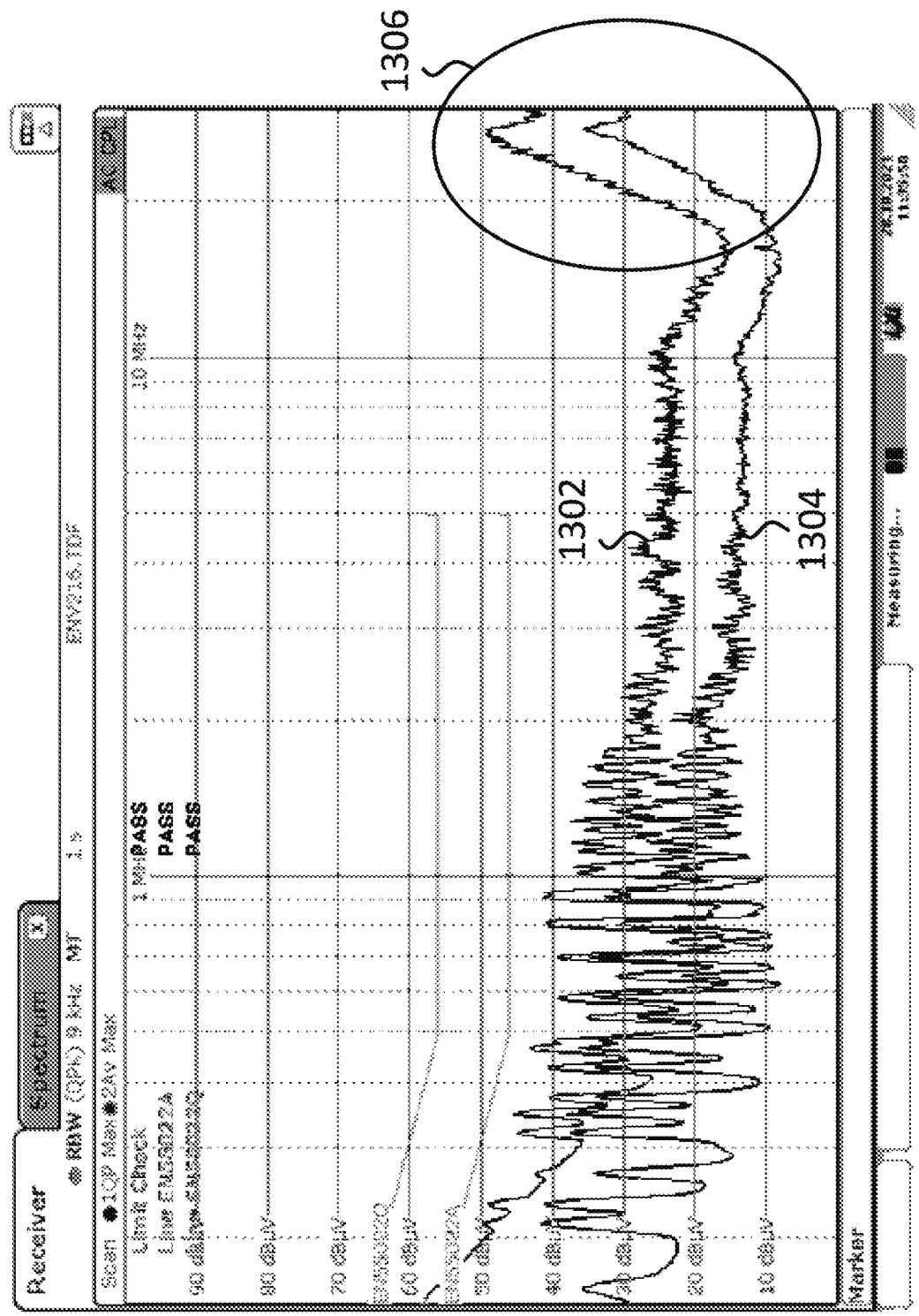

By comparison, FIG. 13 shows a frequency spectrum plot 1300 of conducted EMI for a power converter that is similar to the power converter 100 shown in FIG. 1 when the primary-side switch M1 is transitioned using transition speed S2, in accordance with some embodiments. Plot 1302 shows a quasi-peak measurement of the conducted EMI, plot 1304 shows an average measurement of the conducted EMI, and a region of interest 1306 highlights the measured conducted EMI within the frequency range of 20 MHz to 30 MHz. As shown, as a result of the faster transition speed S2, conducted EMI in the frequency range of 20 MHz to 30 MHz is increased by about 10 dB as compared to the same frequency range shown in FIG. 12 and corresponding to a transition speed of S1 for the primary-side switch M1.

Figure 14:
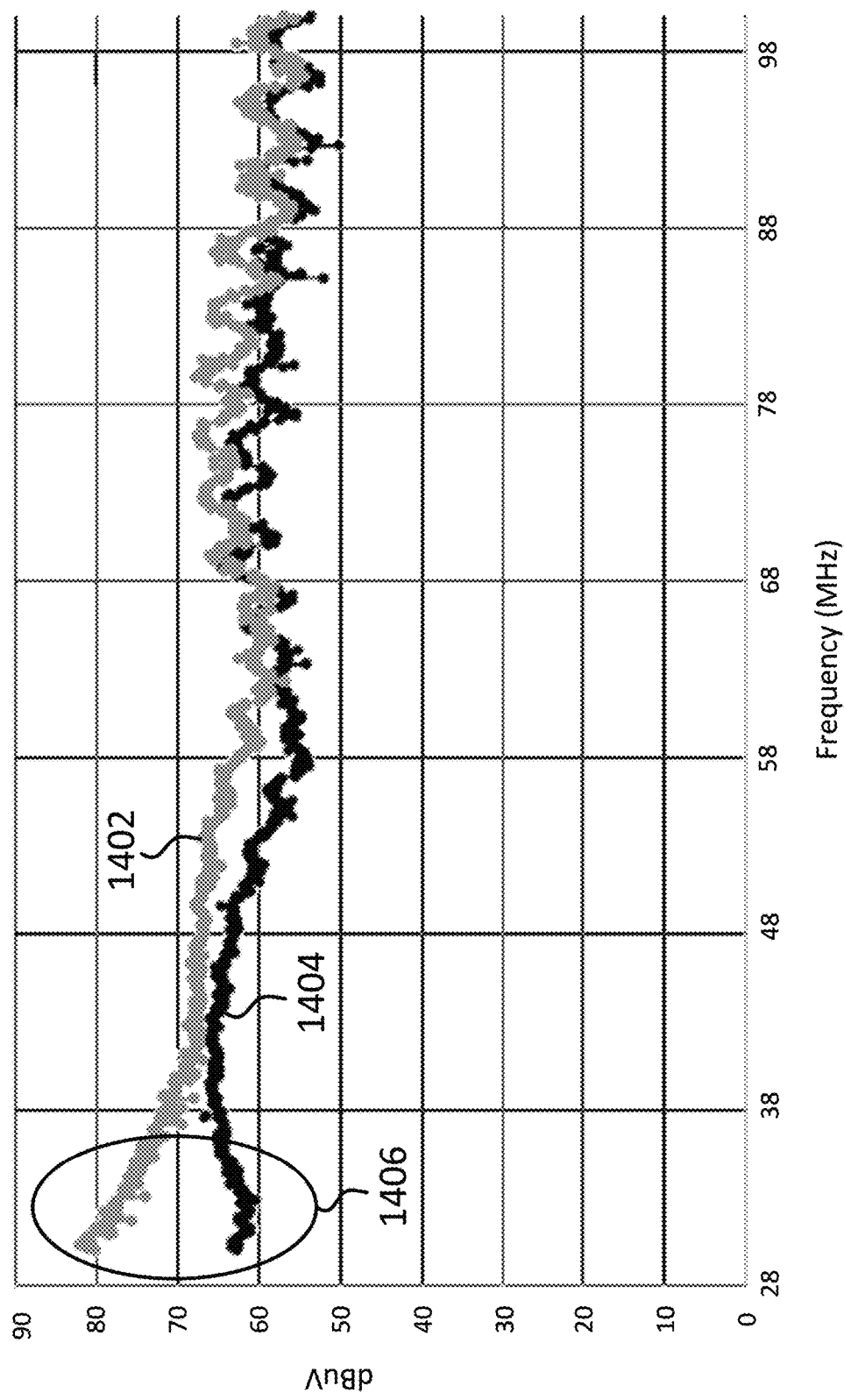

FIG. 14 shows a frequency spectrum plot 1400 of radiated EMI measured near the synchronous rectifier switch M2 for a power converter that is similar to the power converter 100 shown in FIG. 1. In the example shown in FIG. 14, Vin was 230 Vac, Vout was 20V, and the load $R_L$ is 0 Ohms. Plot 1402 shows measured radiated EMI when a switch transition time of the primary-side switch M1 is not controlled to reduce a high-voltage spike and subsequent high-frequency ringing on the secondary-side of the power converter 100, and plot 1404 shows measured radiated EMI when a switch transition time of the primary-side switch M1 is controlled to reduce a high-voltage spike and subsequent high-frequency ringing on the secondary-side of the power converter 100. As shown in the region of interest 1406, there is an almost 20 dB EMI reduction at frequencies less than 38 MHz.

Figure 15:
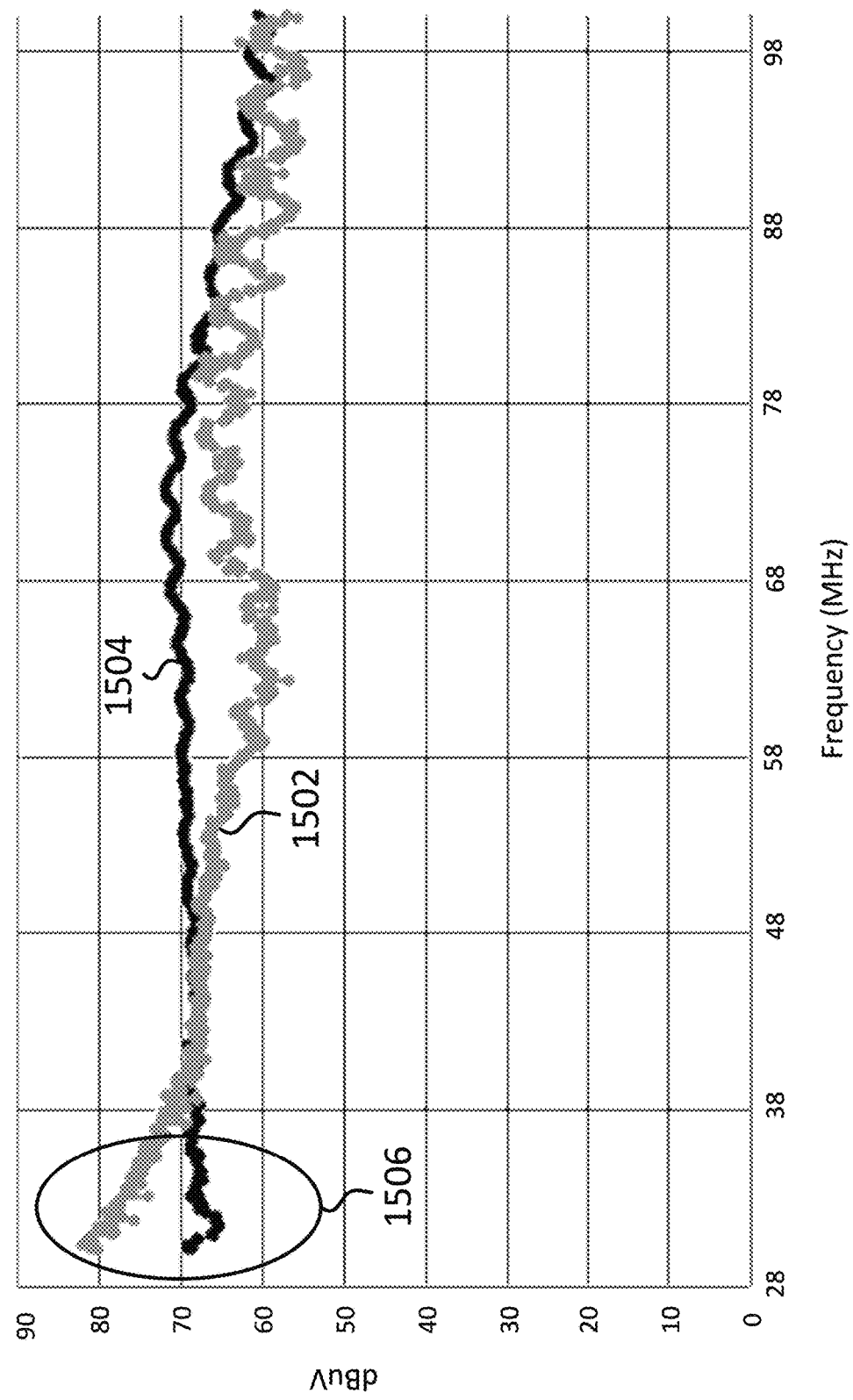

FIG. 15 shows a frequency spectrum plot 1500 of radiated EMI measured near the synchronous rectifier switch M2 for a power converter that is similar to the power converter 100 shown in FIG. 1. In the example shown in FIG. 15, Vin was 230 Vac, Vout was 20V, and the load $R_L$ was a full load. Plot 1502 shows measured radiated EMI when a switch transition time of the primary-side switch M1 is not controlled to reduce a high-voltage spike and subsequent high-frequency ringing on the secondary-side of the power converter 100, and plot 1504 shows measured radiated EMI when a switch transition time of the primary-side switch M1 is controlled to reduce a high-voltage spike and subsequent high-frequency ringing on the secondary-side of the power converter 100. As shown in the region of interest 1506, there is an almost 10 dB noise reduction at frequencies less than 38 MHz.

Figure 16:
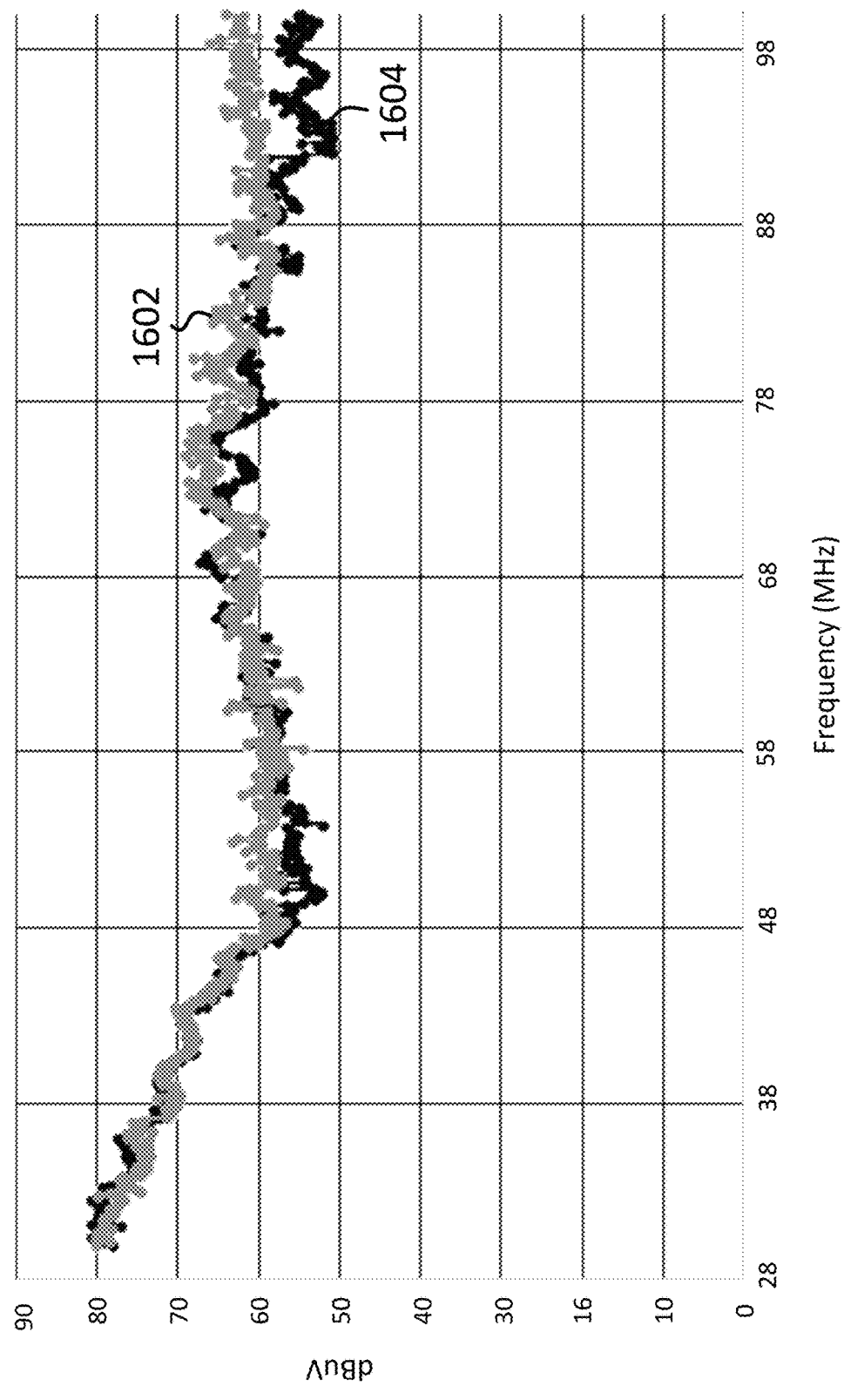

FIG. 16 shows a frequency spectrum plot 1600 of radiated EMI measured near the primary-side switch M1 for a power converter that is similar to the power converter 100 shown in FIG. 1. In the example shown in FIG. 16, Vin was 230 Vac, Vout was 16V, and the load $R_L$ is 0 Ohms. Plot 1602 shows measured radiated EMI when a switch transition time of the primary-side switch M1 is not controlled to reduce a high-voltage spike and subsequent high-frequency ringing on the secondary-side of the power converter 100, and plot 1604 shows measured radiated EMI when a switch transition time of the primary-side switch M1 is controlled to reduce a high-voltage spike and subsequent high-frequency ringing on the secondary-side of the power converter 100. As shown, radiated EMI is not increased when a switch transition time of the primary-side switch M1 is controlled to reduce a high-voltage spike and subsequent high-frequency ringing on the secondary-side of the power converter 100.

Figure 17:
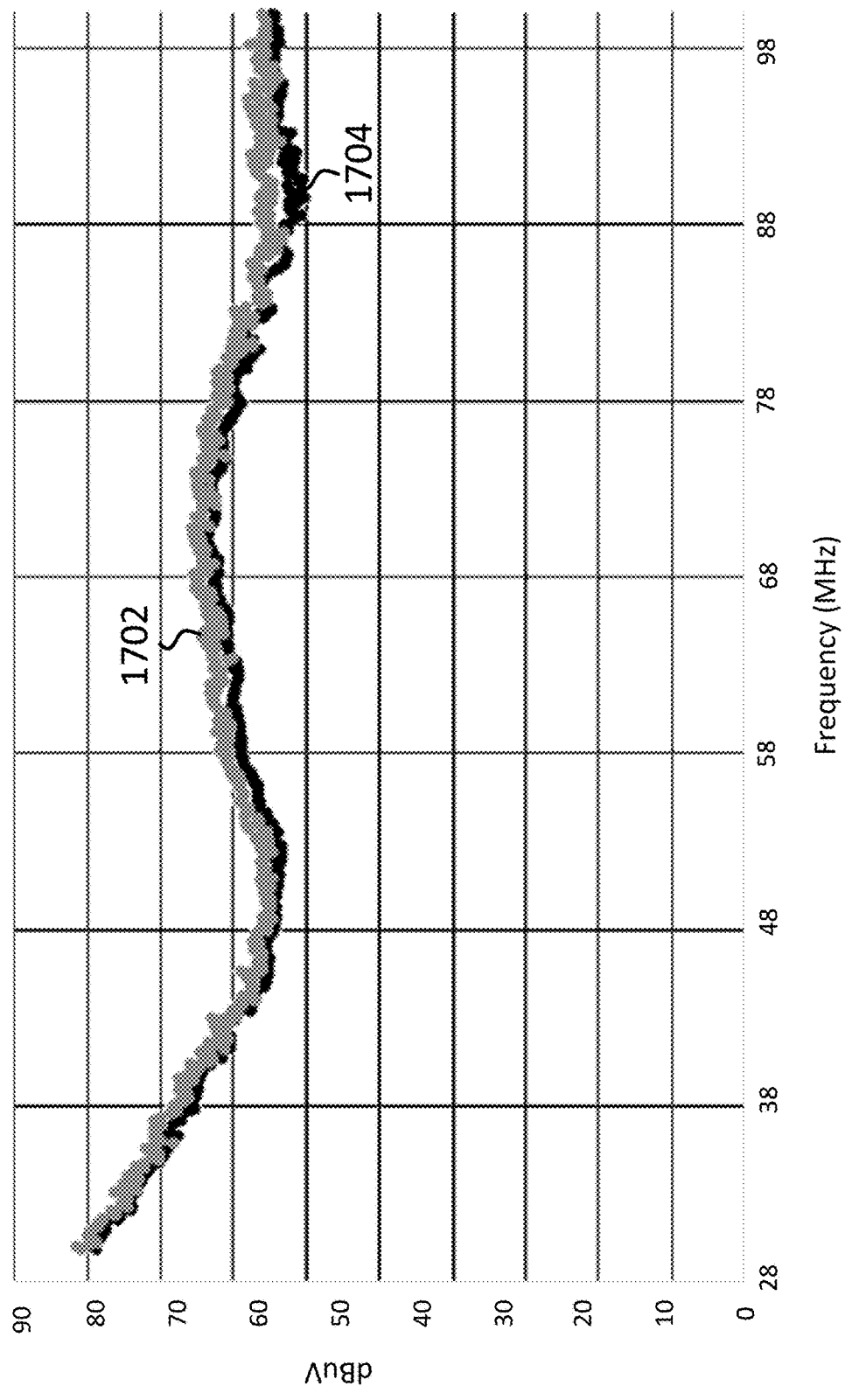

FIG. 17 shows a frequency spectrum plot 1700 of radiated EMI measured near the primary-side switch M1 for a power converter that is similar to the power converter 100 shown in FIG. 1. In the example shown in FIG. 17, Vin was 230 Vac, Vout was 20V, and the load $R_L$ was a full load. Plot 1702 shows measured radiated EMI when a switch transition time of the primary-side switch M1 is not controlled to reduce a high-voltage spike and subsequent high-frequency ringing on the secondary-side of the power converter 100, and plot 1704 shows measured radiated EMI when a switch transition time of the primary-side switch M1 is controlled to reduce a high-voltage spike and subsequent high-frequency ringing on the secondary-side of the power converter 100. As shown, radiated EMI is not increased when a switch transition time of the primary-side switch M1 is controlled to reduce a high-voltage spike and subsequent high-frequency ringing on the secondary-side of the power converter 100.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A control circuit comprising:
   a gate driver circuit to receive a first plurality of primary-side switch control pulses and to generate a first plurality of primary-side gate control pulses therefrom to control a gate node of a primary-side switch of a power converter; and
   a gate drive control module to provide a switch transition speed control signal to the gate driver circuit to control a switch transition speed of the primary-side switch of the power converter for each pulse of the first plurality of primary-side gate control pulses;
   wherein the gate drive control module is configured to set the switch transition speed of the gate driver circuit to a first speed for generating one or more initial pulses of the first plurality of primary-side gate control pulses and is further configured to set the switch transition speed of the gate driver circuit to a second speed for generating one or more subsequent pulses of the first plurality of primary-side gate control pulses.

2. The control circuit of claim 1, wherein:
   setting the switch transition speed of the gate driver circuit to the first speed for generating the one or more initial pulses of the first plurality of primary-side gate control pulses reduces an amplitude of a voltage spike at a drain node of a secondary-side synchronous rectifier switch of the power converter as compared to that corresponding to a switch transition speed that is faster than the first speed.

3. The control circuit of claim 1, wherein:
the second speed is faster than the first speed.

4. The control circuit of claim 1, further comprising:
a valley detection module configured to receive a valley detection signal based on a voltage at an auxiliary winding of a transformer coupled to the primary-side switch and to detect a resonant valley at a drain node of the primary-side switch based on the valley detection signal.

5. The control circuit of claim 4, wherein:
the one or more initial pulses comprise a first plurality of pulses generated before the resonant valley at the drain node of the primary-side switch is detected by the valley detection module; and
the one or more subsequent pulses comprise subsequent pulses generated after the resonant valley at the drain node of the primary-side switch has been detected.

6. The control circuit of claim 4, wherein:
upon detecting, by the valley detection module, a resonant valley before generating one or more initial pulses of a second plurality of primary-side gate control pulses, the gate drive control module is configured to set the switch transition speed of the gate driver circuit to the second speed for generating the one or more initial pulses of the second plurality of primary-side gate control pulses and is further configured to maintain the switch transition speed of the gate driver circuit at the second speed for generating the one or more subsequent pulses of the second plurality of primary-side gate control pulses.

7. The control circuit of claim 1, wherein:
the first plurality of primary-side switch control pulses are a burst sequence of pulses;
the one or more initial pulses is a single initial pulse of the burst sequence of pulses; and
the one or more subsequent pulses are subsequent pulses of the burst sequence of pulses.

8. The control circuit of claim 1, wherein:
the one or more initial pulses is a single first pulse directly after one or more skipped pulses; and
the one or more subsequent pulses are subsequent pulses after a single initial pulse and before a second skipped pulse.

9. A method, comprising:
receiving, at a gate driver circuit, a first plurality of primary-side switch control pulses;
generating, by the gate driver circuit, a first plurality of primary-side gate control pulses based on the first plurality of primary-side switch control pulses to control a gate node of a primary-side switch of a power converter;
providing, by a gate drive control module, a switch transition speed control signal to the gate driver circuit to control a switch transition speed of the primary-side switch of the power converter for each pulse of the first plurality of primary-side gate control pulses;
configuring the gate drive control module to set the switch transition speed of the gate driver circuit to a first speed for generating one or more initial pulses of the first plurality of primary-side gate control pulses; and
configuring the gate drive control module to set the switch transition speed of the gate driver circuit to a second speed for generating one or more subsequent pulses of the first plurality of primary-side gate control pulses.

10. The method of claim 9, wherein:
setting the switch transition speed of the gate driver circuit to the first speed for generating the one or more initial pulses of the first plurality of primary-side gate control pulses reduces an amplitude of a voltage spike at a drain node of a secondary-side synchronous rectifier switch of the power converter as compared to that corresponding to a switch transition speed that is faster than the first speed.

11. The method of claim 9, wherein:
the second speed is faster than the first speed.

12. The method of claim 9, further comprising:
receiving, by a valley detection module, a valley detection signal based on a voltage at an auxiliary winding of a transformer coupled to the primary-side switch; and
detecting, by the valley detection module, a resonant valley at a drain node of the primary-side switch based on the valley detection signal.

13. The method of claim 12, wherein:
the one or more initial pulses comprise a first plurality of pulses generated before the resonant valley at the drain node of the primary-side switch is detected by the valley detection module; and
the one or more subsequent pulses comprise subsequent pulses generated after the resonant valley at the drain node of the primary-side switch has been detected.

14. The method of claim 12, further comprising:
upon detecting, by the valley detection module, a resonant valley before generating one or more initial pulses of a second plurality of primary-side gate control pulses:
configuring the gate drive control module to set the switch transition speed of the gate driver circuit to the second speed for generating the one or more initial pulses of the second plurality of primary-side gate control pulses; and
further configuring the gate drive control module to maintain the switch transition speed of the gate driver circuit at the second speed for generating the one or more subsequent pulses of the second plurality of primary-side gate control pulses.

15. The method of claim 9, wherein:
the first plurality of primary-side switch control pulses are a burst sequence of pulses;
the one or more initial pulses is a single initial pulse of the burst sequence of pulses; and
the one or more subsequent pulses are subsequent pulses of the burst sequence of pulses.

16. The method of claim 9, wherein:
the one or more initial pulses is a single first pulse directly after one or more skipped pulses; and
the one or more subsequent pulses are subsequent pulses after a single initial pulse and before a second skipped pulse.

* * * * *